(12) United States Patent
Imabayashi et al.

(10) Patent No.: US 12,127,420 B2
(45) Date of Patent: Oct. 22, 2024

(54) DISPLAY DEVICE, METHOD FOR MANUFACTURING DISPLAY DEVICE, AND ELECTRONIC APPARATUS

(71) Applicant: SONY SEMICONDUCTOR SOLUTIONS CORPORATION, Kanagawa (JP)

(72) Inventors: Daichi Imabayashi, Kanagawa (JP); Tomoyoshi Ichikawa, Kanagawa (JP)

(73) Assignee: SONY SEMICONDUCTOR SOLUTIONS CORPPORATION, Kanagawa (JP)

( * ) Notice: Subject to any disclaimer, the term of this patent is extended or adjusted under 35 U.S.C. 154(b) by 449 days.

(21) Appl. No.: 17/310,525

(22) PCT Filed: Feb. 7, 2020

(86) PCT No.: PCT/JP2020/004844
§ 371 (c)(1),
(2) Date: Aug. 6, 2021

(87) PCT Pub. No.: WO2020/166511
PCT Pub. Date: Aug. 20, 2020

(65) Prior Publication Data
US 2022/0158120 A1    May 19, 2022

(30) Foreign Application Priority Data
Feb. 15, 2019  (JP) .................. 2019-025522

(51) Int. Cl.
*H10K 50/81*   (2023.01)
*H10K 50/813*  (2023.01)
(Continued)

(52) U.S. Cl.
CPC ......... *H10K 50/813* (2023.02); *H10K 50/822* (2023.02); *H10K 71/00* (2023.02)

(58) Field of Classification Search
CPC .... H10K 50/813; H10K 50/822; H10K 71/00; H10K 59/122; H10K 2102/351;
(Continued)

(56) References Cited

U.S. PATENT DOCUMENTS

2010/0193817 A1*  8/2010  Amamiya .............. H10K 50/00
257/98
2012/0138904 A1*  6/2012  Shimizu ................. H10K 50/11
438/35
(Continued)

FOREIGN PATENT DOCUMENTS

CN    101765929 A    6/2010
CN    101803464 A    8/2010
(Continued)

OTHER PUBLICATIONS

International Search Report and Written Opinion of PCT Application No. PCT/JP2020/004844, issued on Apr. 7, 2020, 12 pages of ISRWO.

*Primary Examiner* — S M Sohel Imtiaz
(74) *Attorney, Agent, or Firm* — CHIP LAW GROUP

(57) ABSTRACT

A display device includes: first electrodes formed to be arranged in a two-dimensional matrix on a substrate; a partition wall part provided between the first electrodes adjacent to each other and having a cross-sectional shape whose width decreases as it moves away from the substrate; an organic layer formed on an entire surface including surfaces of the first electrodes and the partition wall parts and formed by laminating a plurality of material layers; and a second electrode formed on an entire surface including a surface of the organic layer, in which among the plurality of material layers constituting the organic layer, a material layer arranged closest to the second electrode side is formed such that a resistance of a portion located on a slope of the
(Continued)

partition wall part is higher than a resistance of a portion located on the first electrode.

15 Claims, 28 Drawing Sheets

(51) Int. Cl.
  *H10K 50/822* (2023.01)
  *H10K 71/00* (2023.01)
(58) Field of Classification Search
  CPC .. G09F 9/00; G09F 9/30; H05B 33/10; H05B 33/12; H05B 33/22
  See application file for complete search history.

(56) References Cited

U.S. PATENT DOCUMENTS

2012/0326201 A1* 12/2012 Ohnuma ................ H10K 50/11
   438/22
2014/0175470 A1* 6/2014 Yokoyama ............. H10K 50/15
   257/89
2019/0280062 A1* 9/2019 Ma ......................... H10K 59/35

FOREIGN PATENT DOCUMENTS

| | | | |
|---|---|---|---|
| CN | 103887443 A | | 6/2014 |
| EP | 2175504 A1 | | 4/2010 |
| JP | 2005222725 A | * | 8/2005 |
| JP | 2011-014347 A | | 1/2011 |
| JP | 2012-134171 A | | 7/2012 |
| JP | 2013-030476 A | | 2/2013 |
| JP | 2014-123528 A | | 7/2014 |
| JP | 2017-157782 A | | 9/2017 |
| JP | 2019-160396 A | | 9/2019 |
| KR | 10-2009-0002742 A | | 1/2009 |
| KR | 10-2010-0051637 A | | 5/2010 |
| KR | 10-2010-0072265 A | | 6/2010 |
| KR | 10-2013-0007440 A | | 1/2013 |
| TW | 200917888 A | | 4/2009 |
| TW | 200924555 A | | 6/2009 |
| WO | 2009/017026 A1 | | 2/2009 |
| WO | 2009/038171 A1 | | 3/2009 |

* cited by examiner

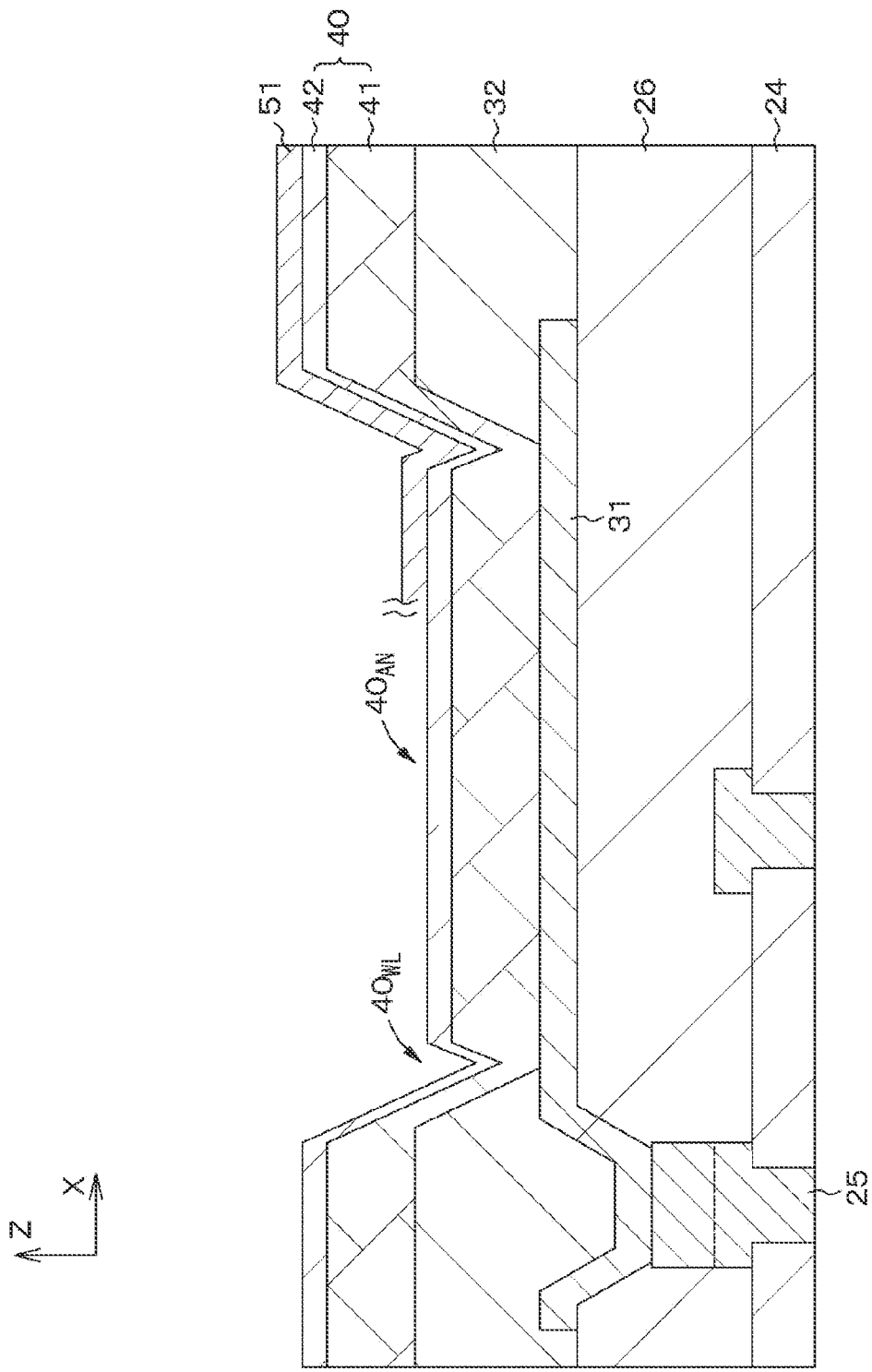

DISPLAY DEVICE, METHOD FOR MANUFACTURING DISPLAY DEVICE, AND ELECTRONIC APPARATUS

CROSS REFERENCE TO RELATED APPLICATIONS

This application is a U.S. National Phase of International Patent Application No. PCT/JP2020/004844 filed on Feb. 7, 2020, which claims priority benefit of Japanese Patent Application No. JP 2019-025522 filed in the Japan Patent Office on Feb. 15, 2019. Each of the above-referenced applications is hereby incorporated herein by reference in its entirety.

TECHNICAL FIELD

The present disclosure relates to a display device, a method for manufacturing a display device, and an electronic apparatus.

BACKGROUND ART

In recent years, organic electro luminescence (EL) display devices using EL of organic materials have attracted attention as display devices replacing liquid crystal display devices. Then, the organic EL display devices are being applied to direct-view type displays, such as a monitor, and ultra-small displays requiring a fine pixel pitch of about several micrometers alike.

A pixel in an organic EL display device usually includes a light emitter including a first electrode provided for each pixel, an organic layer formed on the first electrode, and a second electrode formed on the organic layer. In such a configuration, a partition wall part may be provided between the first electrodes adjacent to each other (see, for example, the first member (reference sign 31) in Patent Document 1).

CITATION LIST

Patent Document

Patent Document 1: Japanese Patent Application Laid-Open No. 2017-157782

SUMMARY OF THE INVENTION

Problems to be Solved by the Invention

In a case where an organic layer is formed on the entire surface including the surfaces of the first electrodes and the partition wall parts, the uniformity of film formation is impaired because the partition wall part protrudes more than the first electrode. For example, the film thickness tends to be small near the boundary between the partition wall part and the first electrode.

Therefore, when the organic layer on the first electrode and the organic layer near the boundary between the partition wall part and the first electrode are compared at the time of driving the display device, a higher electric field is applied to the latter organic layer. Therefore, in a low luminance state, the organic layer near the boundary between the partition wall part and the first electrode tends to easily emit light. However, the film thickness of the organic layer also affects the wavelength of light to be extracted, so that chromaticity changes between the case where the organic layer on the first electrode emits light and the case where the organic layer near the boundary between the partition wall part and the first electrode emits light. For this reason, there occurs a phenomenon that a change in chromaticity is conspicuous in a low luminance state.

Therefore, an object of the present disclosure is to provide a display device that can reduce a phenomenon that chromaticity changes in a low luminance state, an electronic apparatus including the display device, and a method for manufacturing the display device.

Solutions to Problems

A display device according to the present disclosure for achieving the above object includes:
  first electrodes formed to be arranged in a two-dimensional matrix on a substrate;
  a partition wall part provided between the first electrodes adjacent to each other and having a cross-sectional shape whose width decreases as it moves away from the substrate;
  an organic layer formed on an entire surface including surfaces of the first electrodes and the partition wall parts and formed by laminating a plurality of material layers; and
  a second electrode formed on an entire surface including a surface of the organic layer;
  in which among the plurality of material layers constituting the organic layer, a material layer arranged closest to the second electrode side is formed such that a resistance of a portion located on a slope of the partition wall part is higher than a resistance of a portion located on the first electrode.

A method for manufacturing a display device according to the present disclosure for achieving the above object includes steps of:
  forming first electrodes by arranging them in a two-dimensional matrix on a substrate;
  providing, between the first electrodes adjacent to each other, a partition wall part having a cross-sectional shape whose width decreases as it moves away from the substrate;
  forming, on an entire surface including surfaces of the first electrodes and the partition wall parts, an organic layer formed by laminating a plurality of material layers; and
  forming a second electrode on an entire surface including a surface of the organic layer,
  in which in the step of forming the organic layer,
  a material layer arranged closest to the second electrode side, among the material layers constituting the organic layer, is formed such that a resistance of a portion located on a slope of the partition wall part is higher than a resistance of a portion located on the first electrode.

An electronic apparatus according to the present disclosure for achieving the above object includes a display device including:
  first electrodes formed to be arranged in a two-dimensional matrix on a substrate;
  a partition wall part provided between the first electrodes adjacent to each other and having a cross-sectional shape whose width decreases as it moves away from the substrate;
  an organic layer formed on an entire surface including surfaces of the first electrodes and the partition wall parts and formed by laminating a plurality of material layers; and a second electrode formed on an entire surface including a surface of the organic layer, in which among the plurality of material layers constituting the organic layer, a material layer arranged closest to the second electrode side is formed such that a resistance of a portion located on a slope of the partition wall part is higher than a resistance of a portion located on the first electrode.

BRIEF DESCRIPTION OF THE DRAWINGS

FIG. 5 is a schematic partial cross-sectional view for explaining a film formation configuration of an organic layer in a display device of a reference example.

FIGS. 26A and 26B are external views of an interchangeable lens single-lens reflex type digital still camera, in which FIG. 26A shows a front view thereof and FIG. 26B shows a rear view thereof.

MODE FOR CARRYING OUT THE INVENTION

Figure 1:
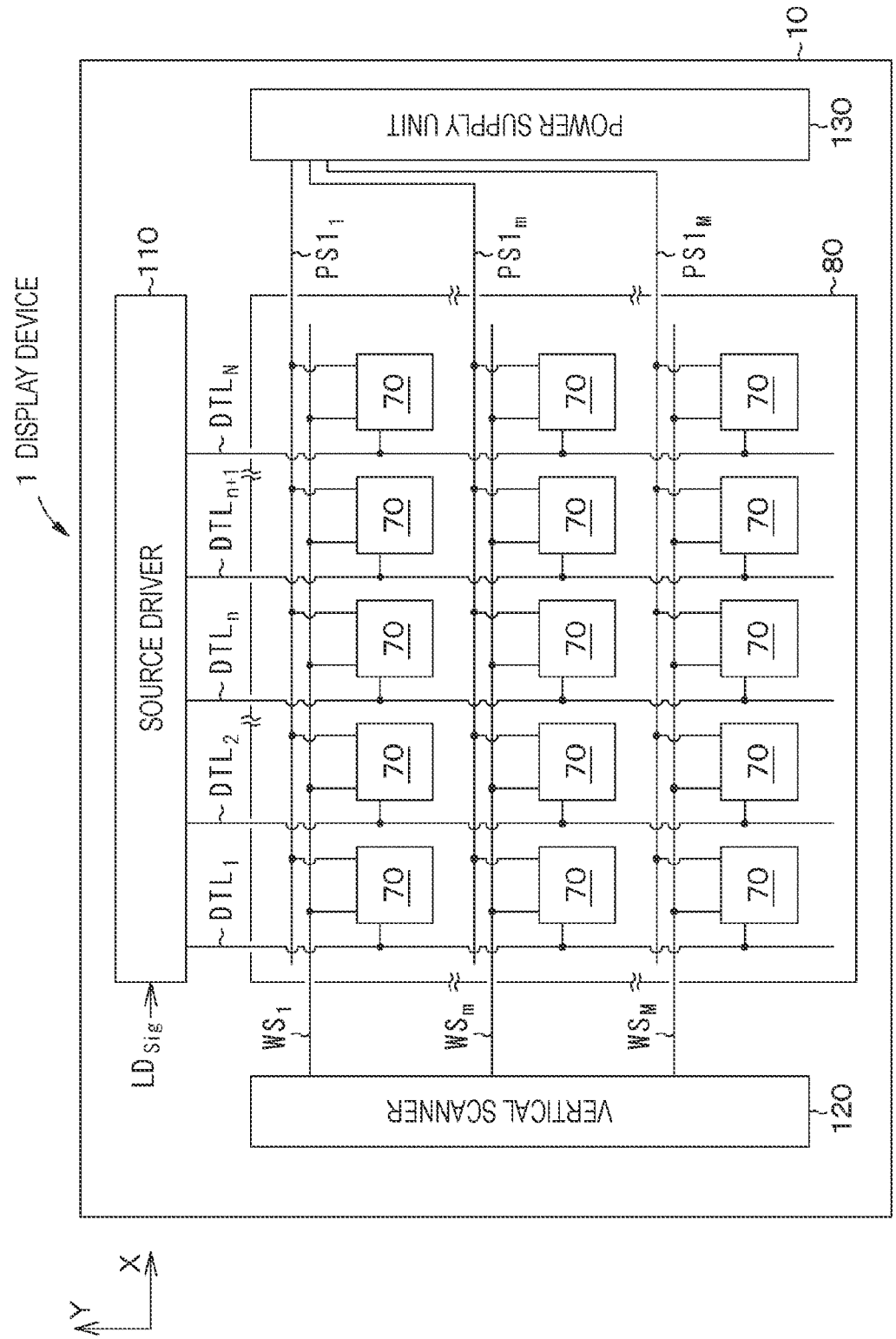
FIG. 1 is a schematic plan view of a display device according to a first embodiment of the present disclosure.

Hereinafter, the present disclosure will be described on the basis of embodiments with reference to the drawings. The present disclosure is not limited to the embodiments, and various numerical values and materials in the embodiments are examples. In the following description, the same reference signs will be used for the same elements or elements having the same functions, and redundant description will be omitted. Note that the description will be given in the following order.

1. Description of display device of the present disclosure, method for manufacturing display device, and electronic apparatus, and general description
2. First Embodiment
3. Second Embodiment
4. Third Embodiment
5. Fourth Embodiment
6. Description of electronic apparatus, and others

Description of Display Device of the Present Disclosure, Method for Manufacturing Display Device, and Electronic Apparatus, and General Description A display device according to the present disclosure, a display device to be used in an electronic apparatus according to the present disclosure, and a display device obtained by a method for manufacturing a display device according to the present disclosure (hereinafter, these may be simply referred to as a "display device of the present disclosure") include, as described above:

first electrodes formed to be arranged in a two-dimensional matrix on a substrate;

a partition wall part provided between the first electrodes adjacent to each other and having a cross-sectional shape whose width decreases as it moves away from the substrate;

an organic layer formed on an entire surface including surfaces of the first electrodes and the partition wall parts and formed by laminating a plurality of material layers; and a second electrode formed on an entire surface including a surface of the organic layer, in which among the plurality of material layers constituting the organic layer, a material layer arranged closest to the second electrode side is formed such that a resistance of a portion located on a slope of the partition wall part is higher than a resistance of a portion located on the first electrode.

Here, the "organic layer formed by laminating a plurality of material layers" means a layer mainly including an organic material, but every layer is not necessarily required to include an organic material. For example, a configuration is also included in which a material layer including an inorganic material or a material layer including an organic material to which an inorganic material is added is included as a part of the plurality of material layers.

In the display device of the present disclosure, the material layer arranged closest to the second electrode side, among the material layers constituting the organic layer, can be constituted such that the portion located on the slope of the partition wall part is formed to be thicker than the portion located on the first electrode. Alternatively, the material layer arranged closest to the second electrode side, among the material layers constituting the organic layer, can be constituted such that the portion located on the slope of the partition wall part is formed to have a higher resistivity than the portion located on the first electrode.

In the display device of the present disclosure including the above various preferred configurations, the material layer arranged closest to the second electrode side, among the material layers constituting the organic layer, can be constituted to include an electron transport material or an electron injection material.

Examples of the electron transport material include materials such as, for example, BCP (2,9-dimethyl-4,7-diphenyl-1,10-phenanthroline), metal complexes of 8-hydroxyquinoline or derivatives thereof, and nitrogen-containing heterocyclic derivatives (for example, tris(8-quinolinol)aluminum complex, benzimidazole derivative, phenanthroline derivative, imidazopyridine derivative). Note that these compounds or complexes may be used alone or in combination of two or more.

Examples of the electron injection material include, for example: alkali metals or alkaline earth metals such as lithium, sodium, magnesium, and calcium; compounds such as lithium fluoride or lithium oxide; and organometallic complexes with alkali metal or alkaline earth metal, such as 8-quinolinol lithium, as the central metal. Note that these compounds or complexes may be used alone or in combination of two or more.

In this case, the material layer arranged closest to the second electrode side, among the material layers constituting the organic layer, can be constituted to include lithium fluoride. Then, the material layer including lithium fluoride can be constituted such that the portion located on the slope of the partition wall part is formed to be thicker than the portion located on the first electrode.

Alternatively, the material layer arranged closest to the second electrode side, among the material layers constituting the organic layer, can be constituted to include a co-deposited film of calcium and lithium fluoride. Then, the material layer including the co-deposited film of calcium and lithium fluoride can be constituted such that the portion located on the slope of the partition wall part is formed to be thicker than the portion located on the first electrode. Alternatively, the material layer including the co-deposited film of calcium and lithium fluoride can be constituted such that the portion located on the slope of the partition wall part is formed to have a higher resistivity than the portion located on the first electrode by being formed such that a concentration of lithium fluoride in the portion located on the slope of the partition wall part is higher than a concentration of lithium fluoride in the portion located on the first electrode.

In the display device of the present disclosure including the above various preferred configurations, the organic layer can be constituted to include a light-emitting layer formed in common for each first electrode. This configuration has an advantage that it is not necessary to separately paint light-emitting layer, which is suitable for miniaturization. In this case, a configuration can be formed in which the organic layer emits white light and color display is made in combination with a color filter.

Alternatively, the organic layer can also be constituted to include a light-emitting layer formed individually for each first electrode. Although disadvantageous for miniaturization, this configuration has an advantage that a color filter is not required for color display, which can provide excellent luminous efficiency.

As described above, the method for manufacturing a display device according to the present disclosure includes steps of:
    providing, between first electrodes adjacent to each other, a partition wall part having a cross-sectional shape whose width decreases as it moves away from a substrate;
    forming, on an entire surface including surfaces of the first electrodes and the partition wall parts, an organic layer formed by laminating a plurality of material layers; and
    forming a second electrode on an entire surface including a surface of the organic layer,
    in which in the step of forming the organic layer,
    a material layer arranged closest to the second electrode side, among the material layers constituting the organic layer, is formed such that a resistance of a portion located on a slope of the partition wall part is higher than a resistance of a portion located on the first electrode.

In the above method for manufacturing a display device according to the present disclosure, the material layer arranged closest to the second electrode side, among the material layers constituting the organic layer, can be constituted such that the portion located on the slope of the partition wall part is formed to be thicker than the portion located on the first electrode. Alternatively, the material layer arranged closest to the second electrode side, among the material layers constituting the organic layer, can also be constituted such that the portion located on the slope of the partition wall part is formed to have a higher resistivity than the portion located on the first electrode.

The light emitter constituting the pixel includes the first electrode, the organic layer, and the second electrode. For example, the first electrode is an anode electrode for injecting holes into the organic layer, and the second electrode is a cathode electrode for injecting electrons into the organic layer. In the case of a so-called top emission type in which light generated in the organic layer is emitted to the cathode electrode side, the first electrode is constituted to have light reflectivity, and the second electrode is constituted to have light transmittance.

The electrode having light reflectivity preferably shows a high reflectance for the emission wavelength of the organic layer, and can be constituted to include a single metal such as, for example, chromium (Cr), gold (Au), platinum (Pt), nickel (Ni), copper (Cu), molybdenum (Mo), tungsten (W), titanium (Ti), or tantalum (Ta), or an alloy thereof. Note that the electrode may include a single layer structure or a laminated structure.

Furthermore, the electrode having light transmittance can be constituted by using a transparent conductive material such as an indium-tin oxide (indium tin oxide (ITO) including Sn-doped $In_2O_3$, crystalline ITO, or amorphous ITO) or an indium-zinc oxide (indium zinc oxide (IZO)). Note that a metal film thinned to an extent of having light transmittance may also be used.

The organic layer can be constituted to include various light-emitting layers such as a red light-emitting layer, a green light-emitting layer, and a blue light-emitting layer. In a case where white light is to be emitted, the organic layer can be formed to include a laminated structure thereof, a laminated structure including a blue light-emitting layer that emits blue light and a yellow light-emitting layer that emits yellow light, or a laminated structure including a blue light-emitting layer that emits blue light and an orange light-emitting layer that emits orange light.

The light-emitting material constituting the light-emitting layer may be fluorescent or phosphorescent. The configuration of the light-emitting material is not particularly limited, and well-known materials, such as a mixture (red light emission) of 4,4-bis(2,2-diphenylvinin)biphenyl (DPVBi) and 2,6-bis[(4'-methoxydiphenylamino)styryl]-1,5-dicyanonaphthalene (BSN), a mixture (blue light emission) of DPVBi and 4,4'-bis[2-{4-(N,N-diphenylamino) phenyl}vinyl]biphenyl (DPAVBi), and a mixture (green light emission) of DPVBi and coumarin 6, can be used. Furthermore, the light-emitting layer for each color can be formed by appropriately adding a material that can transport carriers such as electrons and holes, in addition to the above light-emitting materials.

In a case where a color display configuration is formed, one pixel can be constituted to include a plurality of sub-pixels. Specifically, one pixel can be constituted to include three sub-pixels of a red display sub-pixel, a green display sub-pixel, and a blue display sub-pixel. Furthermore, one pixel can be constituted to further include one set in which one type of a sub-pixel or multiple types of sub-pixels is/are added to these three types of sub-pixels (for example, one set including a sub-pixel that emits white light to improve luminance, one set including a sub-pixel that emits complementary color to expand a color reproduction range, one set including a sub-pixel that emits yellow to expand a color reproduction range, or one set including sub-pixels that each emit yellow and cyan to expand a color reproduction range).

Examples of the numbers of pixels of a display device include some image display resolutions, such as VGA(640, 480), S-VGA(800, 600), XGA(1024, 768), APRC (1152, 900), S-XGA(1280, 1024), U-XGA (1600, 1200), HD-TV (1920, 1080), Q-XGA(2048, 1536), and in addition to them (1920, 1035), (720, 480), and (1280, 960), but the numbers are not limited to these.

An insulating layer, a protective film, etc., to be used in the display device can be formed using materials appropriately selected from publicly-known inorganic materials and organic materials, and can be formed by a well-known film forming method such as a physical vapor deposition method (PVD method) exemplified by a vacuum vapor deposition method or a sputtering method, or one of various chemical vapor deposition methods (CVD methods). Furthermore, in a case where they are patterned, the patterning can be performed by a combination of well-known patterning methods such as an etching method and a lift-off method.

In the display device according to the present disclosure, the configuration of a pixel circuit and the like that control light emission of the light emitter is not particularly limited. The light emitter is formed in, for example, a certain flat surface on the substrate, and can be constituted to be arranged, for example, above the pixel circuit that drives the light emitter via an interlayer insulating layer. The configuration of a transistor constituting the pixel circuit is not particularly limited. A p-channel field-effect transistor or an n-channel field-effect transistor may be used.

The constituent material of the substrate can be exemplified by a semiconductor material, a glass material, or a plastic material. In a case where the pixel circuit includes a transistor formed on the semiconductor substrate, it is sufficient if a configuration is formed in which a well region is provided on a semiconductor substrate including, for example, silicon and the transistor is formed in the well. On the other hand, in a case where the pixel circuit includes a thin film transistor and the like, a semiconductor thin film is formed on a substrate including a glass material or a plastic material, so that the pixel circuit can be formed thereon. Various wirings can be constituted to include well-known configurations or structures.

Predetermined circuits, such as a source driver that drives the display device, can be constituted by using well-known circuit elements. For example, the vertical scanner, the power supply unit, and the like, shown in FIG. 1, can also be constituted by using well-known circuit elements.

Furthermore, electronic apparatuses including the display device of the present disclosure can be exemplified by direct-view type or projection type display devices and various electronic apparatuses having an image display function.

The conditions shown in the various expressions in the present description are satisfied not only in a case where the expressions are mathematically strictly satisfied but also in a case where the expressions are substantially satisfied. In relation to the satisfaction of the expressions, the presence of various variations caused in designing or manufacturing the display device is allowed. Furthermore, the drawings used in the following description are schematic. For example, FIG. 3 described later shows the cross-sectional structure of the display device, but does not show ratios of a width, a height, a thickness, and the like.

First Embodiment

A first embodiment relates to a display device, a method for manufacturing a display device, and an electronic apparatus according to a first aspect of the present disclosure.

FIG. 1 is a schematic plan view of a display device according to the first embodiment of the present disclosure.

A display device 1 includes scan lines WS and feed lines PS1, provided for each pixel row arranged along the row direction (X direction in FIG. 1), and data lines DTL provided for each pixel column arranged along the column direction (Y direction in FIG. 1). Each of pixels 70 is connected to the scan line WS, the feed line PS1, and the data line DTL, and they are arranged in a two-dimensional matrix of N pixels in the row direction, M pixels in the column direction, and a total of N×M pixels.

The pixels 70 arranged in a two-dimensional matrix constitute a display region (pixel array unit) 80 that displays an image. The number of rows of the pixels 70 in the display region 80 is M, and the number of the pixels 70 constituting each row is N.

The number of each of the scan lines WS and the feed lines PS1 is M. The pixels 70 in the m-th row (where m=1, 2 . . . , M) are connected to an m-th scan line WS$_m$ and an m-th feed line PS1$_m$, and constitutes one pixel row. Furthermore, the number of the data lines DTL is N. The pixels 70 in the n-th column (where n=1, 2 . . . , N) are connected to an n-th data line DTL$_n$.

Note that although not shown in FIG. 1, the display device 1 includes a common feed line commonly connected to all the pixels 70. For example, a ground potential is supplied to the common feed line as a common voltage.

The display device 1 further includes various circuits such as a source driver 110, a vertical scanner 120, and a power supply unit 130 in order to drive the display region 80. Note that in the example shown in FIG. 1, each of the vertical scanner 120 and the power supply unit 130 is arranged on one end side of the display region 80, but this is merely an example.

The display region 80, the source driver 110, the vertical scanner 120, and the power supply unit 130 are constituted to be integrated with a substrate 10. That is, the display device 1 is a display device with integrated driver circuit.

A signal LD$_{Sig}$ representing a grayscale corresponding to an image to be displayed is input to the source driver 110 from, for example, a device (not shown). The signal LD$_{Sig}$ is, for example, a low-voltage digital signal. The source driver 110 is used to generate an analog signal corresponding to the grayscale value of the video signal LD$_{Sig}$ and supply the analog signal to the data line DTL as a video signal. The generated analog signal is a signal whose maximum value is substantially equal to the power supply voltage supplied to the source driver 110 and whose amplitude is about several volts.

The vertical scanner 120 supplies a scan signal to the scan line WS. By this scan signal, the pixels 70 are line-sequentially scanned, for example, row by row. The power supply unit 130 will be described as continuously supplying a predetermined power supply voltage V$_{CC}$ (for example, about 10 volts) to the feed line PS1 regardless of the scanning of the scan line WS. Note that the power supply unit 130 may be configured to switch the voltage to be supplied to the feed line PS1 corresponding to the scanning of the scan line WS.

The display device 1 is, for example, a display device for color display in which a group including three pixels 70 arranged in the row direction constitutes one color pixel. Therefore, if N'=N/3 holds, N' color pixels in the row direction, M color pixels in the column direction, and a total of N'×M color pixels are arranged in the display region 80.

As described above, the pixels 70 are line-sequentially scanned row by row by the scan signal of the vertical scanner 120. The pixel 70 located in the m-th row and the n-th column is hereinafter referred to as an (n,m)-th pixel 70.

In the display device 1, N pixels 70 arranged in the m-th row are simultaneously driven. In other words, in the N pixels 70 arranged along the row direction, the light emission/non-light emission timing is controlled in units of rows to which they belong. When a display frame rate of the display device 1 is expressed as FR (times/second), a scanning period per row when the display device 1 is line-sequentially scanned row by row (so-called horizontal scanning period) is less than (1/FR)×(1/M) seconds.

The outline of the display device 1 has been described above. Next, details of the pixel 70 will be described.

Figure 2:
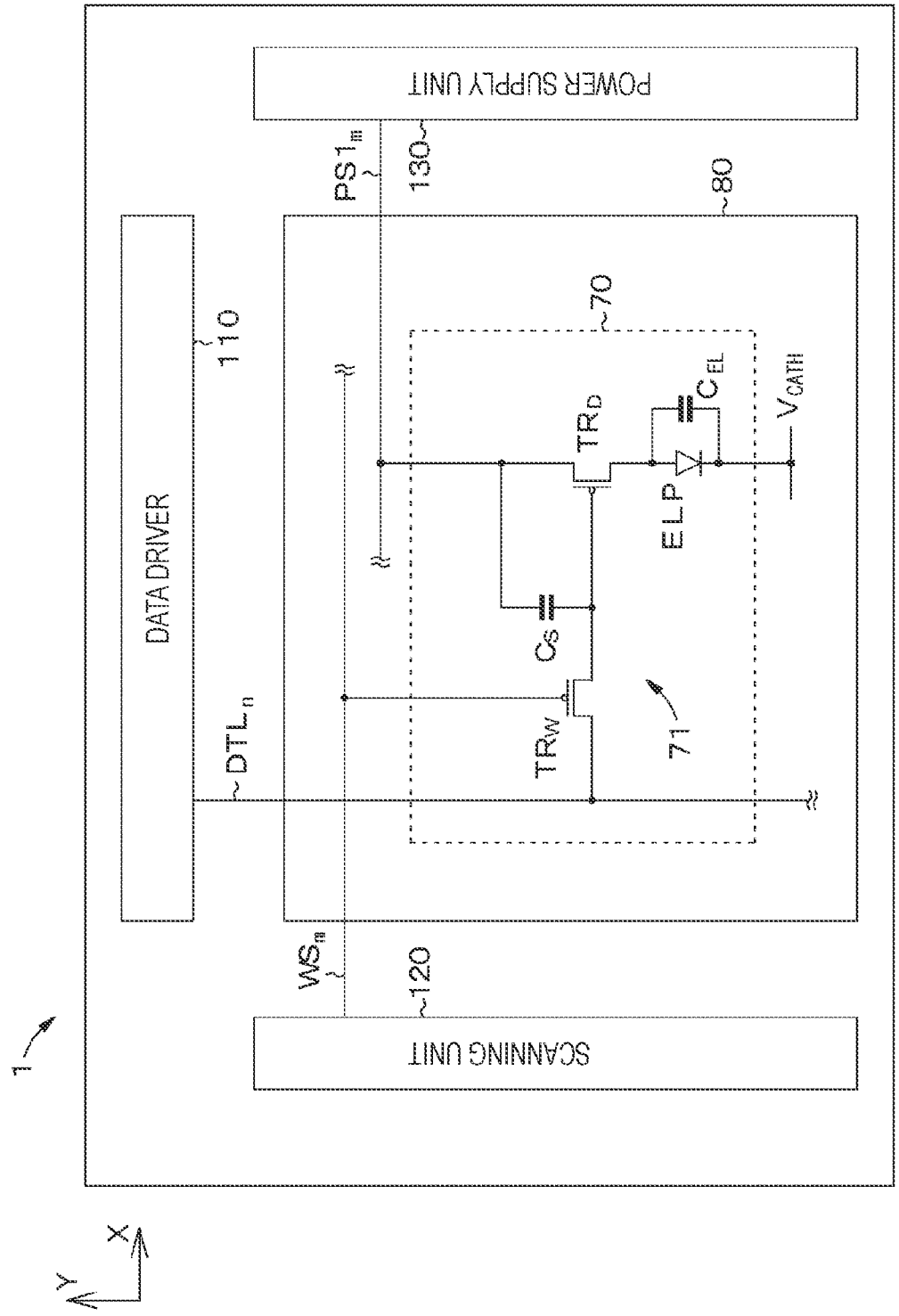
FIG. 2 is a schematic circuit view of a pixel.

First, a circuit configuration of the pixel 70 will be described. FIG. 2 is a schematic circuit view of the pixel.

Note that for convenience of illustration, FIG. 2 shows a wiring relationship for one pixel 70, more specifically, the (n,m)-th pixel 70.

As shown in FIG. 2, the pixel (display element) 70 includes a current-driven light emitter ELP and a pixel circuit 71 for driving the light emitter ELP. The pixel circuit 71 includes at least a write transistor TR$_W$ for writing a video signal and a drive transistor TR$_D$ for applying a current to the light emitter ELP. These are each constituted by a p-channel transistor.

The pixel circuit 71 further includes a capacitor C$_S$. The capacitor C$_S$ is used to hold a voltage (so-called gate-source voltage) of a gate electrode with respect to a source region of the drive transistor TR$_D$. At the time of light emission of the pixel 70, one source/drain region (the side connected to the feed line PS1 in FIG. 2) of the drive transistor TR$_D$ serves as a source region, and the other source/drain region serves as a drain region.

One electrode and the other electrode constituting the capacitor C$_S$ are connected to the one source/drain region and the gate electrode of the drive transistor TR$_D$, respectively. The other source/drain region of the drive transistor TR$_D$ is connected to an anode electrode of the light emitter ELP.

The light emitter ELP is a current-driven light emitter whose light emission luminance changes according to a flowing current value, and specifically includes an organic electroluminescent light emitter. The configuration of the light emitter ELP will be described later in detail with reference to FIG. 3 described later.

The other end (specifically, cathode electrode) of the light emitter ELP is connected to the common feed line. A predetermined voltage V$_{CATH}$ (for example, ground potential) is supplied to the common feed line. Note that the capacitance of the light emitter ELP is indicated by a reference sign C$_{EL}$. In a case where the capacitance C$_{EL}$ of the light emitter ELP is small and a problem occurs in driving the pixel 70, or the like, it is sufficient if an auxiliary capacitance to be connected in parallel to the light emitter ELP is provided as necessary.

The write transistor TR$_W$ has a gate electrode connected to the scan line WS, one source/drain region connected to the data line DTL, and the other source/drain region connected to the gate electrode of the drive transistor TR$_D$. As a result, a signal voltage from the data line DTL is written to the capacitor C$_S$ via the write transistor TR$_W$.

As described above, the capacitor C$_S$ is connected between the one source/drain region and the gate electrode of the drive transistor TR$_D$. The power supply voltage V$_{CC}$ is applied to the one source/drain region of the drive transistor TR$_D$ from the power supply unit 130 via the feed line PS1$_m$. When a video signal voltage V$_{Sig}$ from the data line DTL is written to the capacitor C$_S$ via the write transistor TR$_W$, the capacitor C$_S$ holds a voltage, such as (V$_{CC}$-V$_{Sig}$), as the gate-source voltage of the drive transistor TR$_D$. A drain current I$_{ds}$ expressed by the following expression (1) flows through the drive transistor TR$_D$, and the light emitter ELP emits light with a luminance corresponding to the current value.

$$I_{ds}=k\cdot\mu\cdot((V_{CC}-V_{Sig})-|V_{th}|)^2 \qquad (1)$$

where

μ: effective mobility,

L: channel length,

W: channel width,

V$_{th}$: threshold voltage, $C_{ox}$: (relative permittivity of gate insulating layer)×(permittivity of vacuum)/(thickness of gate insulating layer), and $$k=(\tfrac{1}{2})\cdot(W/L)\cdot C_{ox}.$$

Note that the configuration of the pixel circuit 71 described above is merely an example. In practice, the pixel circuit may have various configurations.

The circuit configuration of the pixel 70 has been described above. Subsequently, a three-dimensional arrangement relationship of various components constituting the display device 1 will be described.

Figure 3:
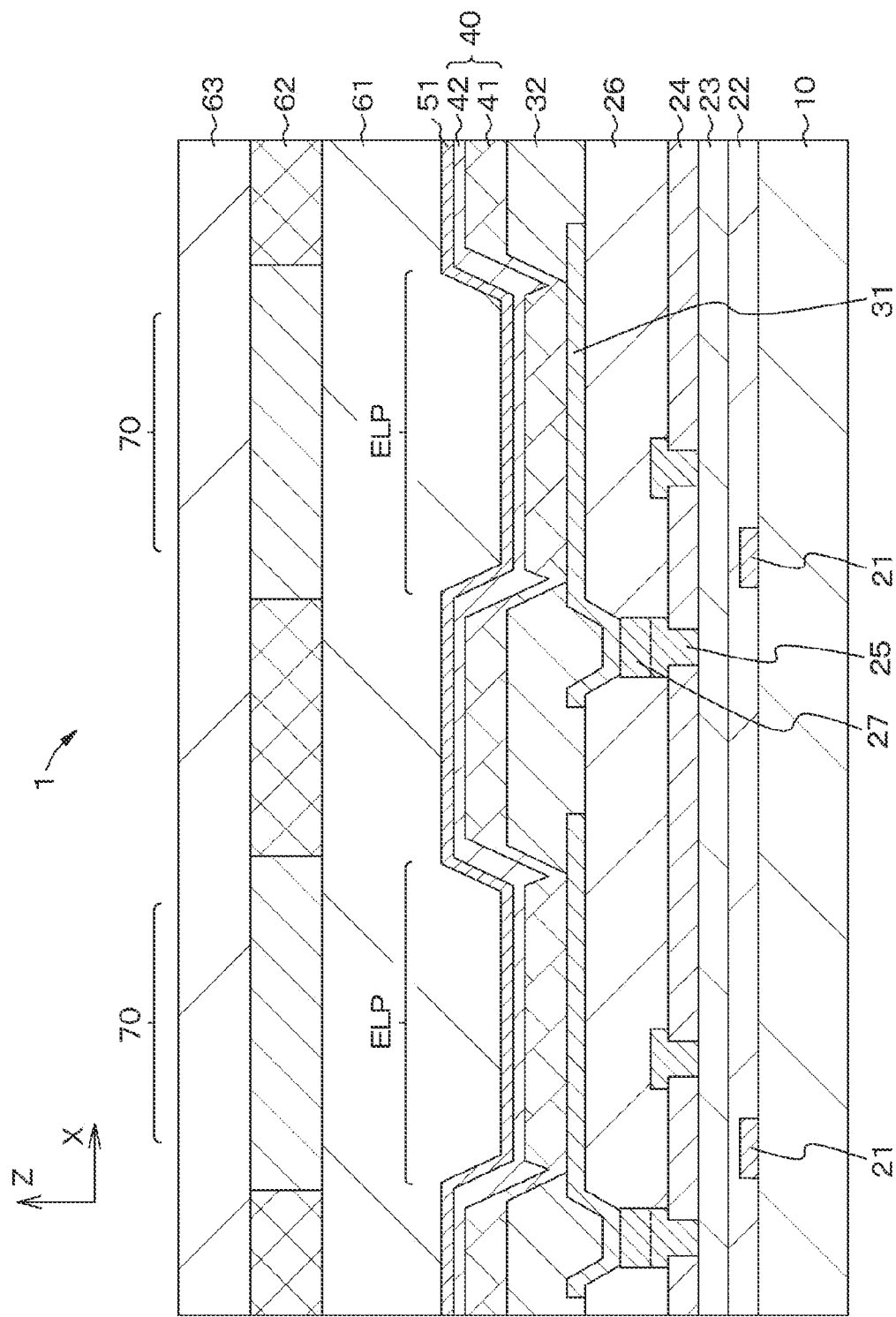
FIG. 3 is a schematic partial cross-sectional view of a portion including a pixel in a display region.
Figure 4:
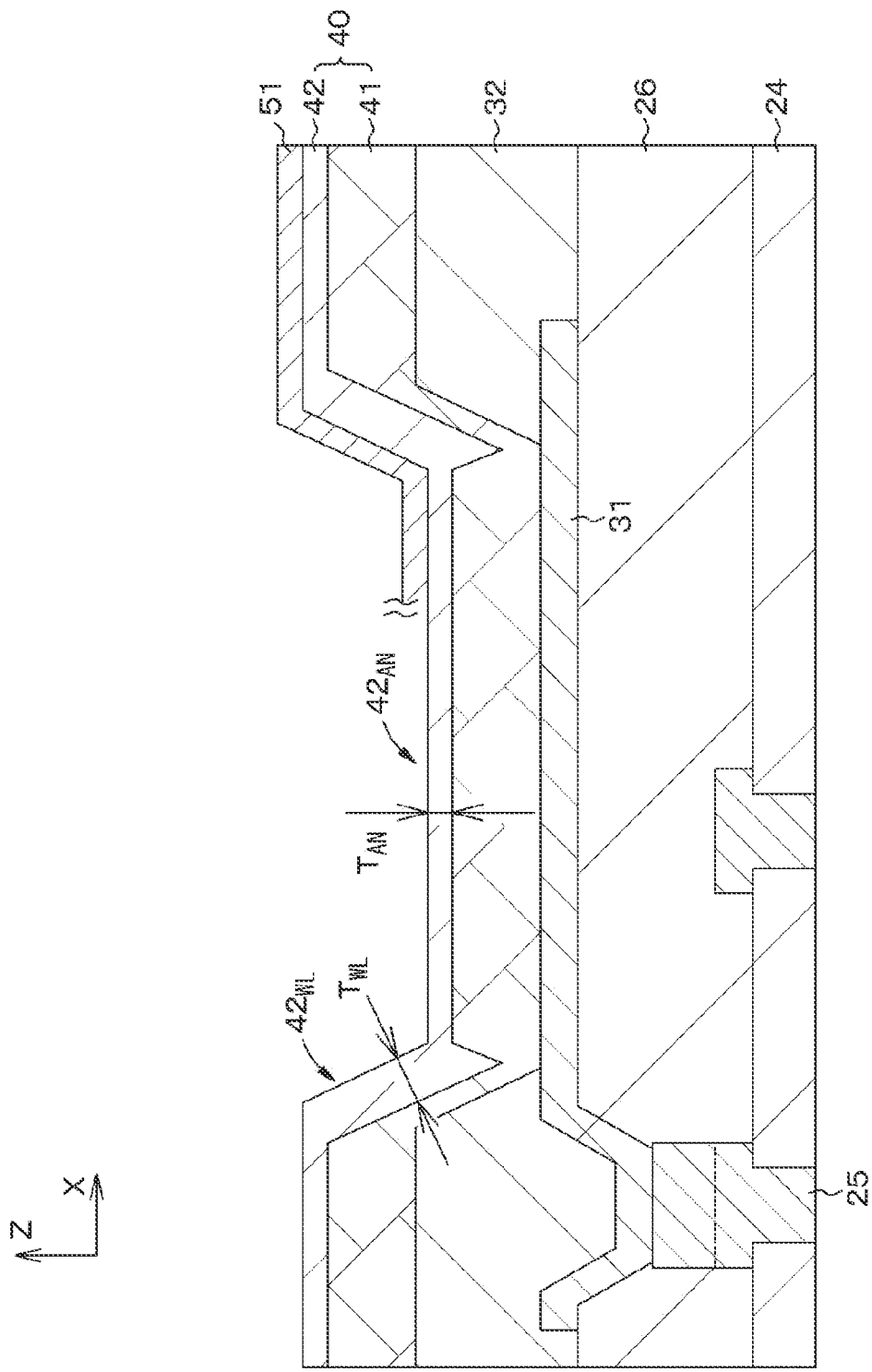
FIG. 4 is a schematic partial cross-sectional view for explaining a film formation configuration of an organic layer.

FIG. 3 is a schematic partial cross-sectional view of a portion including the pixel in the display region. FIG. 4 is a schematic partial cross-sectional view for explaining a film formation configuration of the organic layer.

As shown in FIG. 3, the display device 1 includes:
first electrodes 31 formed to be arranged in a two-dimensional matrix on the substrate 10;
a partition wall part 32 provided between the first electrodes 31 adjacent to each other and having a cross-sectional shape whose width decreases as it moves away from the substrate 10;
an organic layer 40 formed on an entire surface including surfaces of the first electrodes 31 and the partition wall parts 32 and formed by laminating a plurality of material layers; and
a second electrode 51 formed on an entire surface including a surface of the organic layer 40.

Among the plurality of material layers constituting the organic layer 40, a material layer 42 arranged closest to the second electrode 51 side is formed such that a resistance of a portion located on a slope of the partition wall part 32 is higher than a resistance of a portion located on the first electrode 31. More specifically, the material layer 42 arranged closest to the second electrode 51 side, among the material layers constituting the organic layer 40, is formed such that the portion located on the slope of the partition wall part 32 is thicker than the portion located on the first electrode 31. The relationship between the thicknesses of the material layer 42 will be described later in detail with reference to FIG. 4.

First, an outline of various components will be described with reference to FIG. 3.

The substrate 10 includes, for example, a glass material. On the substrate 10, the pixel circuit 71 including a transistor that controls light emission of the light emitter ELP is formed.

On the substrate 10, gate electrodes 21 of various transistors constituting the pixel circuit 71 are formed. The gate electrode 21 can be formed using, for example, metal such as aluminum (Al), polysilicon, or the like. A gate insulating film 22 is provided on an entire surface of the substrate 10 so as to cover the gate electrodes 21. The gate insulating film 22 can be formed using, for example, a silicon oxide ($SiO_x$), a silicon nitride ($SiN_x$), or the like.

A semiconductor material layer 23 is formed on the gate insulating film 22. The semiconductor material layer 23 can be formed using amorphous silicon, polycrystalline silicon, an oxide semiconductor, or the like. Furthermore, a partial region of the semiconductor material layer 23 is doped with impurities to form a source/drain region. Moreover, a region of the semiconductor material layer 23, located between one source/drain region and the other source/drain region and located over the gate electrode 21, forms a channel region. As a result, a bottom gate type thin film transistor is formed on the substrate 10. Note that for convenience of illustration, the source/drain region and the channel region are not shown.

An interlayer insulating film 24 is formed on the semiconductor material layer 23. The interlayer insulating film 24 includes, for example, a silicon oxide ($SiO_x$), a silicon nitride ($SiN_x$), a silicon oxynitride ($SiO_xN_y$), or the like. A source/drain electrode 25 is connected to the semiconductor material layer 23 via a contact hole provided in the interlayer insulating film 24. The source/drain electrode 25 includes metal such as, for example, aluminum (Al).

Then, a flattening film 26 is formed to cover an entire surface including the surface of the electrode 25. The flattening film 26 is formed to cover the transistor and the like for flattening. The flattening film 26 can be formed using an organic insulating film such as a polyimide-based resin, an acrylic-based resin, or a novolac-based resin, or an inorganic insulating film such as a silicon oxide ($SiO_x$), a silicon nitride ($SiN_x$), or an acid silicon nitride ($Si_xN_y$).

The first electrodes 31 are formed to be arranged in a two-dimensional matrix on the flattening film 26. The first electrode 31 is connected to the source/drain electrode 25 of the drive transistor via a contact plug 27 provided in the flattening film 26. Note that the gate electrode 21, the electrode 25, the contact plug 27, and the like are schematically shown, and all the components of the pixel circuit 71 shown in FIG. 2 are not shown. For example, an electrode constituting the capacitor $C_S$ shown in FIG. 2 is not shown.

The partition wall part 32 is provided between the first electrodes 31 adjacent to each other in order to separate each of the first electrodes 31. The partition wall part 32 has a cross-sectional shape whose width decreases as it moves away from the substrate 10, and is formed by, for example, forming an opening in a material layer constituting the partition wall part 32, the opening having a shape whose bottom is located on the first electrode 31 side and the opposite side is open. The partition wall part 32 can be formed using an inorganic oxide, an inorganic nitride, an inorganic oxynitride, a resin material, or the like.

The organic layer 40 is formed on the entire surface including the surfaces of the first electrodes 31 and the partition wall parts 32. The organic layer 40 includes a light-emitting layer formed in common for each first electrode 31 in order to emit white light. Then, the second electrode 51 that is transparent is formed on the entire surface including the surface of the organic layer 40.

The organic layer 40 is constituted by laminating a plurality of material layers, such as a hole injection layer, a hole transport layer, a red light-emitting layer, a light emission separation layer, a blue light-emitting layer, a green light-emitting layer, an electron transport layer, from the first electrode 31 side. The reference sign 42 indicates, among the material layers constituting the organic layer 40, the material layer arranged closest to the second electrode 51 side.

In the display device 1, the material layer 42 includes an electron transport material such as BCP. The reference sign 41 indicates a material layer excluding the material layer 42 in the organic layer 40. Note that for convenience of illustration, the reference sign 41 is shown as one layer. The same applies to other embodiments described later.

The second electrode 51 that is transparent is formed on the entire surface including the surface of the organic layer 40. The second electrode 51 includes a material having good light transmittance and a small work function. Here, the second electrode will be described as including an indium zinc oxide (IZO). The thickness of the second electrode is set to be, for example within a range of 10 to 200 nanometers.

The light emitter ELP shown in FIG. 2 is constituted by the portion where the first electrode 31, the organic layer 40, and the second electrode 51 are laminated. The first electrode 31 functions as the anode electrode, and the second electrode 51 functions as the cathode electrode.

The protective film 61 is formed on an entire surface including the surface of the second electrode 51. The protective film 61 is for preventing moisture from entering the organic layer 40, and is formed to have a thickness of about 1 to 8 μm using a material having a low water permeability. As a material of the protective film 61, a silicon nitride ($SiN_x$), a silicon oxide ($SiO_x$), an aluminum oxide ($AlO_x$), a titanium oxide ($TiO_x$), or a combination thereof is used.

On the protective film 61, a counter substrate 63 on which a color filter 62 is formed is arranged. The counter substrate 63 can be arranged on the protective film 61 by being pasted together with an ultraviolet curable resin, a thermosetting resin, or the like.

The outline of the various components has been described above. Subsequently, the film formation configuration of the organic layer 40 will be described in detail.

FIG. 4 is a schematic partial cross-sectional view for explaining a film formation configuration of the organic layer.

In the display device 1, the material layer 42 arranged closest to the second electrode 51 side and including an electron transport material such as BCP, among the material layers constituting the organic layer 40, is formed such that a portion (indicated by a reference sign $42_{WL}$) located on the slope of the partition wall part 32 is thicker than a portion (indicated by a reference sign $42_{AN}$) located on the first electrode 31. That is, thickness $T_{WL}$ of material layer $42_{WL}$>thickness $T_{AN}$ of material layer $42_{AN}$. As a result, the material layer 42 is constituted such that a resistance of the portion located on the slope of the partition wall part 32 is higher than a resistance of the portion located on the first electrode 31.

Here, in order to help understand the present disclosure, a film formation configuration of an organic layer according to a conventional configuration will be described.

FIG. 5 is a schematic partial cross-sectional view for explaining a film formation configuration of an organic layer in a display device of a reference example.

In a case where a film is formed on the entire surface including the surfaces of the first electrodes 31 and the partition wall parts 32 by, for example, rotational vapor deposition or line vapor deposition, the film thickness depends on a relationship between an evaporation direction from a vapor deposition source and an angle formed by the first electrode 31 on the substrate 10 and the surface of the partition wall part 32. Qualitatively, the thickness of the formed film on the slope of the partition wall part 32 becomes relatively small. Therefore, an organic layer (indicated by a reference sign $40_{WL}$) located on the slope of the partition wall part 32 is thinner than an organic layer (indicated by a reference sign $40_{AN}$) located on the first electrode 31, as shown in FIG. 5.

Therefore, when the organic layer $40_{AN}$ on the first electrode 31 is compared with the organic layer $40_{WL}$ near the boundary between the partition wall part 32 and the first electrode 31, a relatively high electric field is applied to the latter organic layer. Therefore, in a low luminance state, the organic layer $40_{WL}$ tends to easily emit light. Furthermore, the organic layer $40_{WL}$ has a film thickness different from that of the organic layer $40_{AN}$, so that there occurs a phenomenon that a change in chromaticity is conspicuous in a low luminance state.

On the other hand, in the film formation configuration of the organic layer shown in FIG. 4, the resistance of the portion located on the slope of the partition wall part 32 in the material layer 42 is higher than the resistance of the portion located on the first electrode 31. Therefore, the light emission of the organic layer 40 near the boundary between the partition wall part 32 and the first electrode 31 is suppressed, so that a change in chromaticity in a low luminance state can be reduced.

The detailed structure of the display device 1 including the film formation configuration of the organic layer 40 has been described above. Subsequently, a method for manufacturing the display device 1 will be described.

A method for manufacturing the display device 1 includes steps of:

forming the first electrodes 31 by arranging them in a two-dimensional matrix on the substrate 10;

providing, between the first electrodes 31 adjacent to each other, the partition wall part 32 having a cross-sectional shape whose width decreases as it moves away from the substrate 10;

forming, on an entire surface including the surfaces of the first electrodes 31 and the partition wall parts 32, the organic layer 40 by laminating a plurality of material layers; and forming the second electrode 51 on the entire surface including the surface of the organic layer 40, in which in the step of forming the organic layer 40, the material layer arranged closest to the second electrode 51 side, among the material layers constituting the organic layer 40, is formed such that a resistance of the portion located on the slope of the partition wall part 32 is higher than a resistance of the portion located on the first electrode 31. More specifically, the material layer arranged closest to the second electrode 51 side, among the material layers constituting the organic layer 40, is formed such that the portion located on the slope of the partition wall part 32 is thicker than the portion located on the first electrode 31.

FIGS. 6A, 6B, 7, 8, 9, 10, 11, and 12 are schematic partial end views for explaining the method for manufacturing the display device according to the first embodiment.

Hereinafter, the method for manufacturing the display device 1 will be described in detail with reference to these views.

Figure 6A:
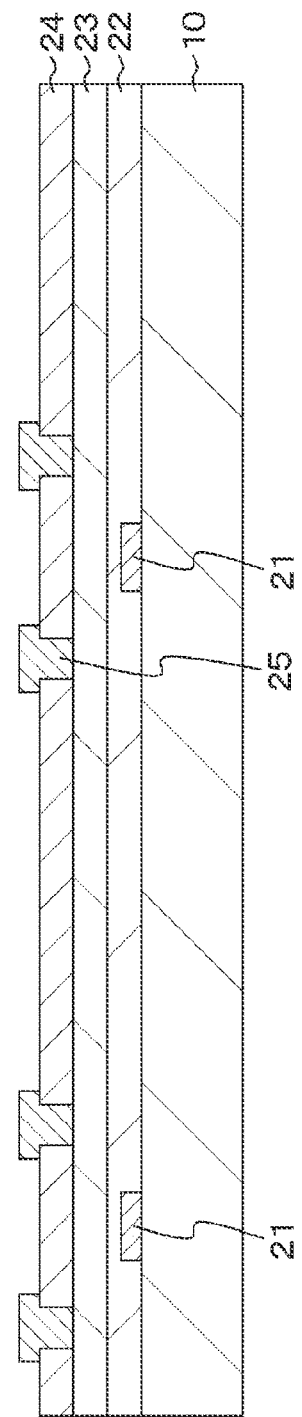
FIGS. 6A and 6B are schematic partial end views for explaining a method for manufacturing the display device according to the first embodiment.
Figure 6B:
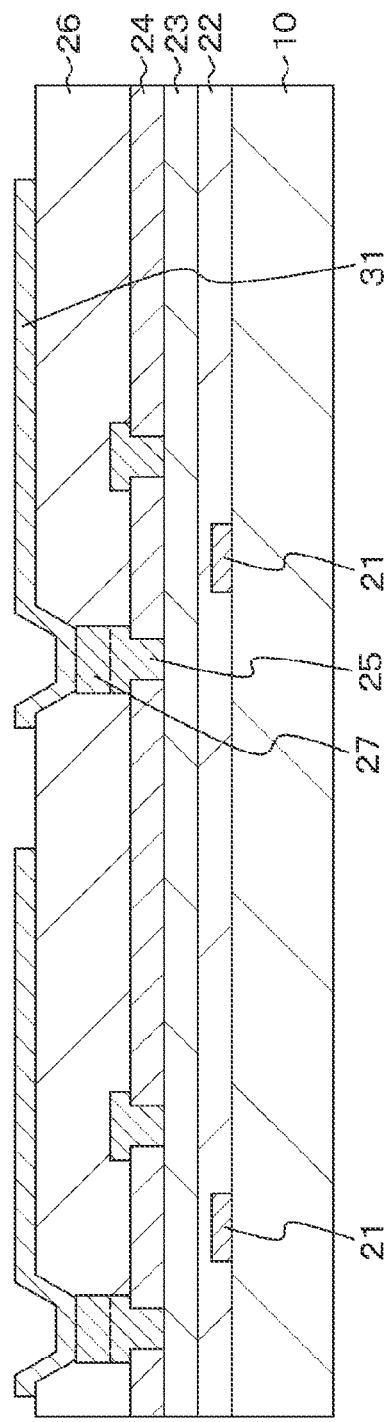

[Step-100] (See FIGS. 6A and 6B)

The substrate 10 is prepared, and a pixel circuit including a thin film transistor is formed on the substrate 10 through predetermined film formation and patterning processes. Subsequently, the interlayer insulating film 24 is formed on the entire surface of the pixel circuit by a spin coating method, a slit coating method, a sputtering method, a CVD method, or the like. Next, after an opening is formed in the interlayer insulating film 24, the electrode 25 is formed in the opening (see FIG. 6A).

After the flattening film 26 is formed to cover the entire surface including the surface of the electrode 25, the contact plug 27 to be connected to the other source/drain electrode of the drive transistor is embedded. Next, the first electrodes 31 to be arranged in a two-dimensional matrix are formed on the flattening film 26 (see FIG. 6B).

Figure 7:
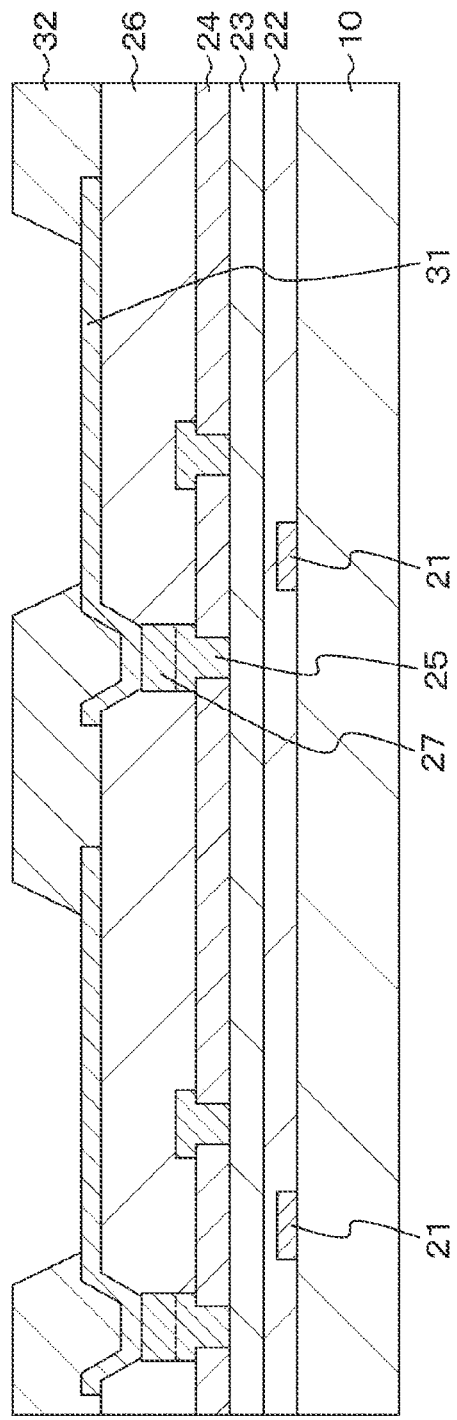
FIG. 7 is a schematic partial end view for explaining the method for manufacturing the display device according to the first embodiment, following FIG. 6B.
Figure 8:
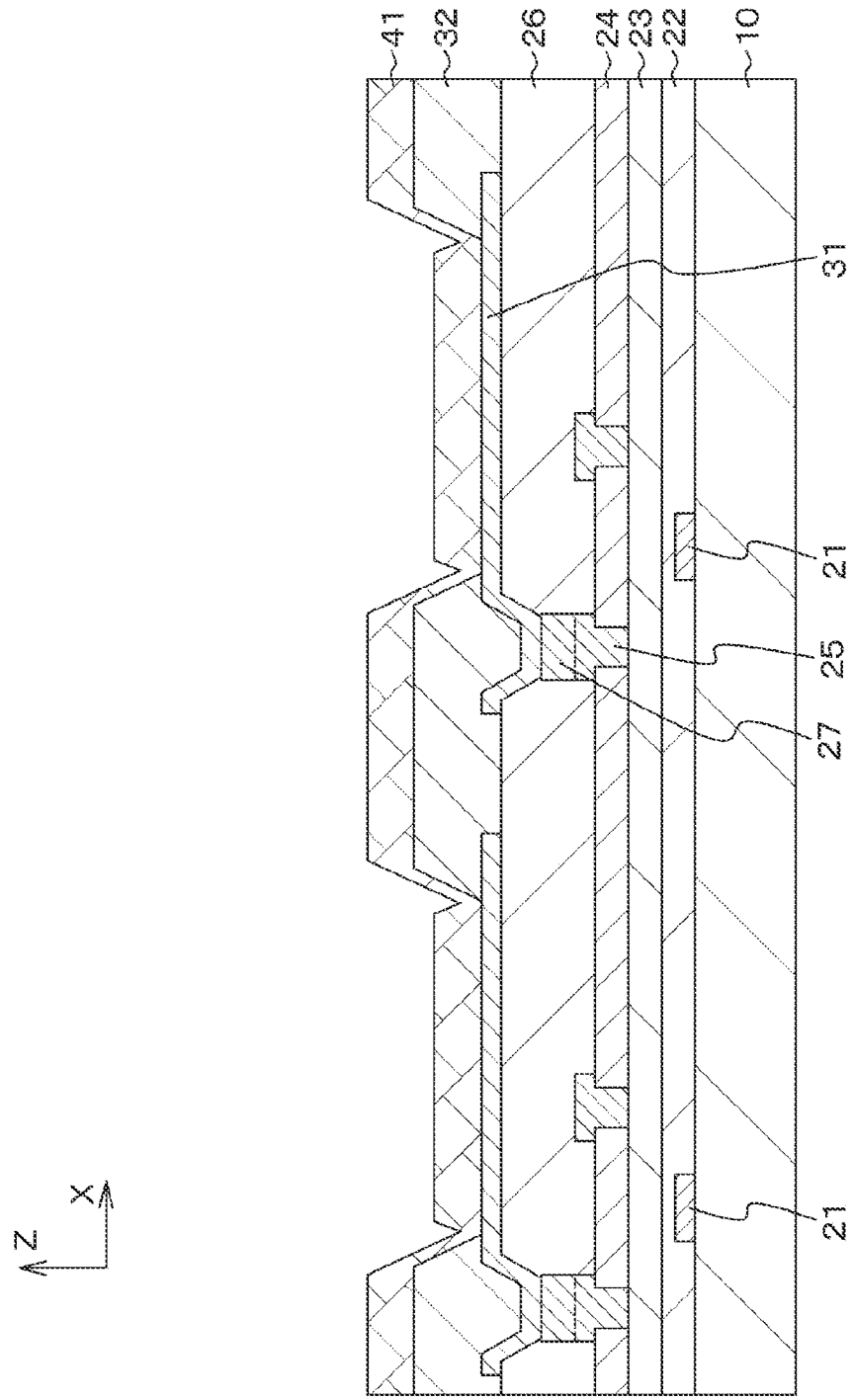
FIG. 8 is a schematic partial end view for explaining the method for manufacturing the display device according to the first embodiment, following FIG. 7.
Figure 9:
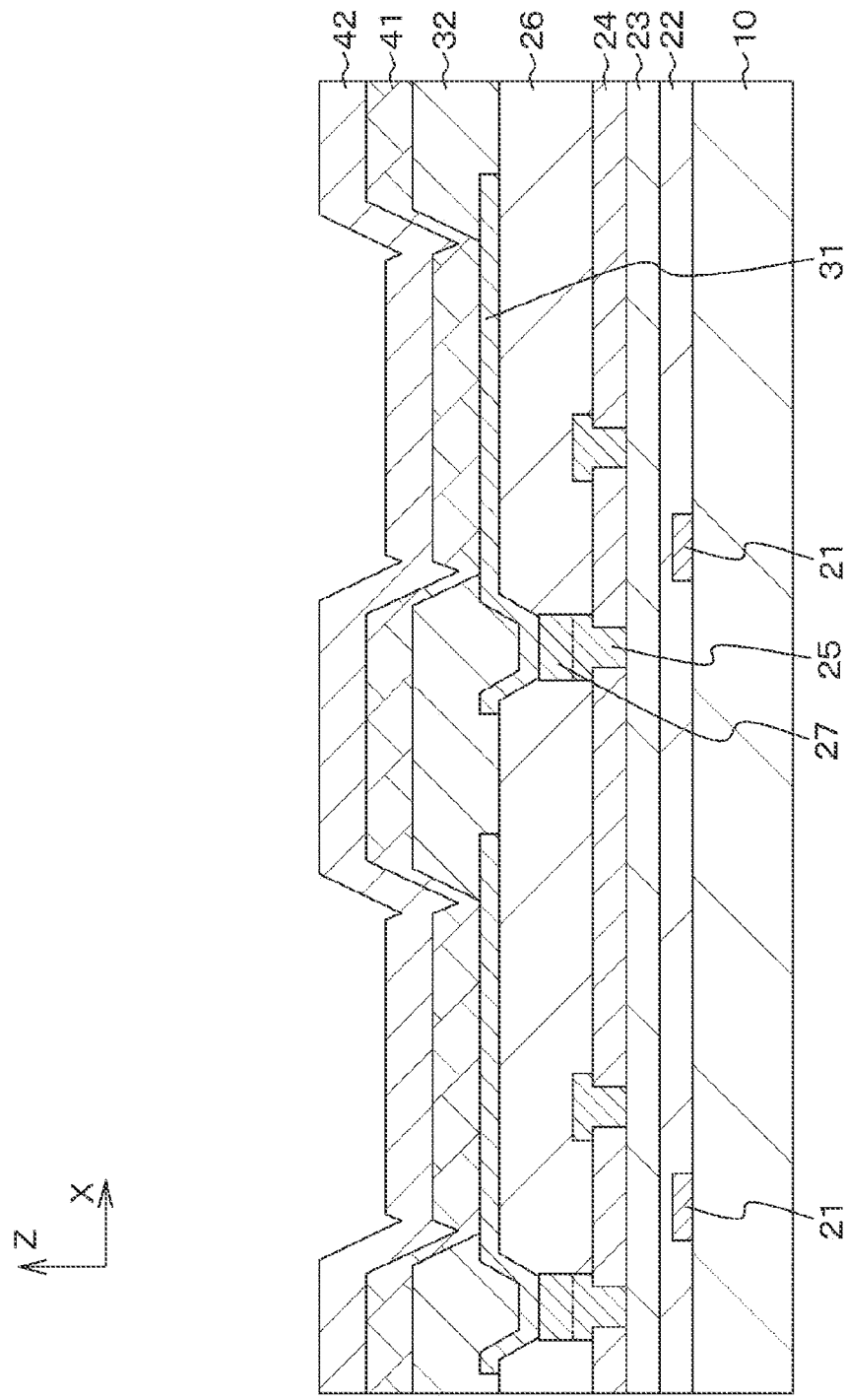
FIG. 9 is a schematic partial end view for explaining the method for manufacturing the display device according to the first embodiment, following FIG. 8.

[Step-110] (See FIG. 7)

Thereafter, the partition wall part 32 as an inter-pixel insulating film is formed between the first electrodes 31 adjacent to each other. An inorganic insulating film, such as a silicon oxynitride, is formed on the entire surface including the first electrodes 31 by a sputtering method, a CVD method, or the like. Next, the formed inorganic insulating film is subjected to a lithography method and a dry etching method to form an opening having a shape whose bottom is located on the first electrode 31 side and the opposite side is open. As a result, the partition wall part 32, having a cross-sectional shape whose width decreases as it moves away from the substrate 10, can be provided.

[Step-120] (See FIGS. 8, 9, 10, and 11)

Thereafter, the organic layer 40 that emits, for example, white light is formed on the entire surface including the surfaces of the first electrodes 31 and the partition wall parts 32. First, for example, a hole injection layer, a hole transport layer, a red light-emitting layer, a light emission separation layer, a blue light-emitting layer, and a green light-emitting layer are sequentially formed as the material layer 41 on the first electrode 31 side that excludes the material layer 42 (see FIG. 8).

Next, the material layer 42 including an electron transport material is formed on the entire surface. At this time, the material layer 42 is formed to be so thick that a sufficient film thickness can be secured on the slope of the partition wall part 32 even after the plasma processing described later (see FIG. 9).

Figure 10:
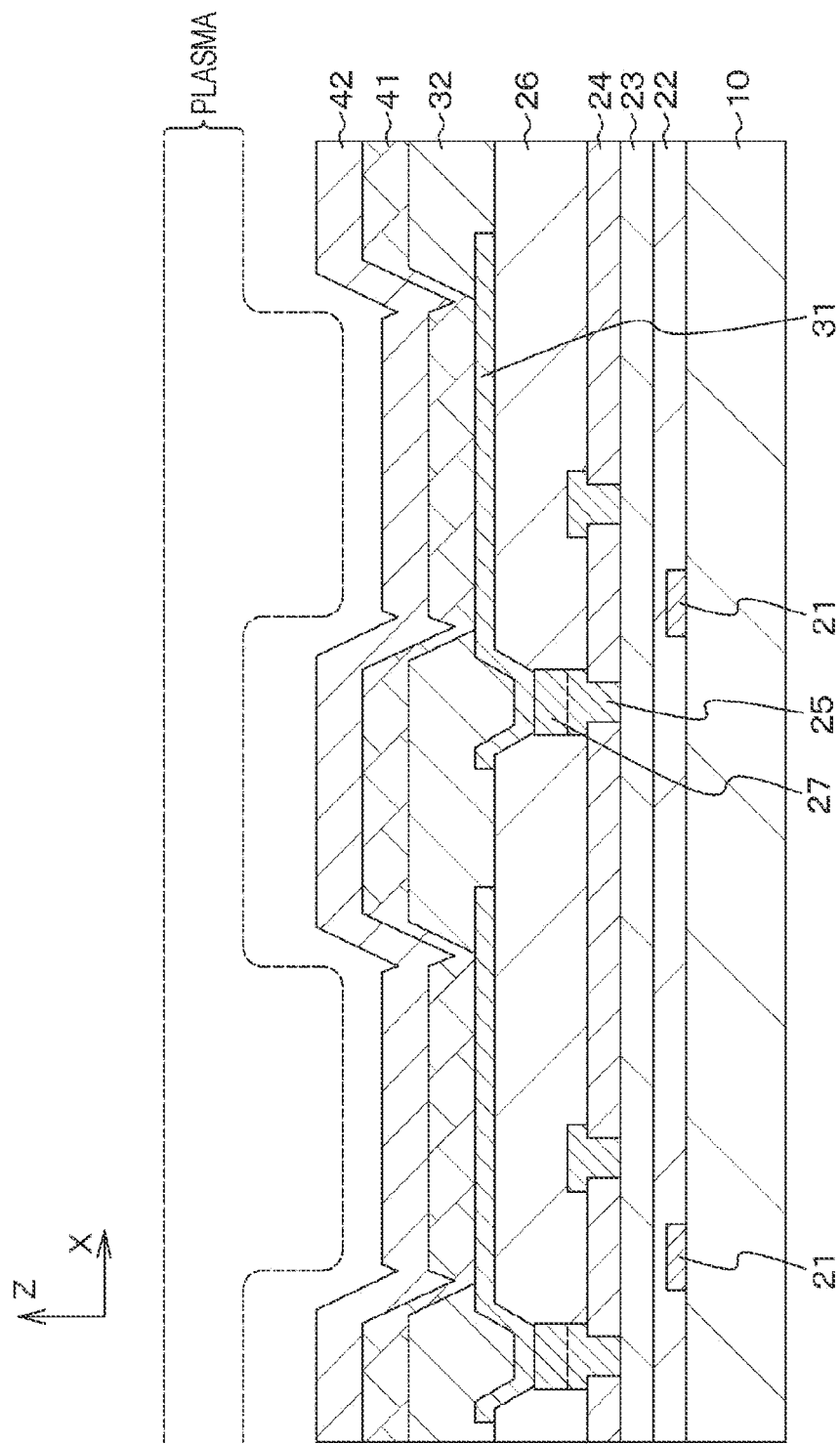
FIG. 10 is a schematic partial end view for explaining the method for manufacturing the display device according to the first embodiment, following FIG. 9.
Figure 11:
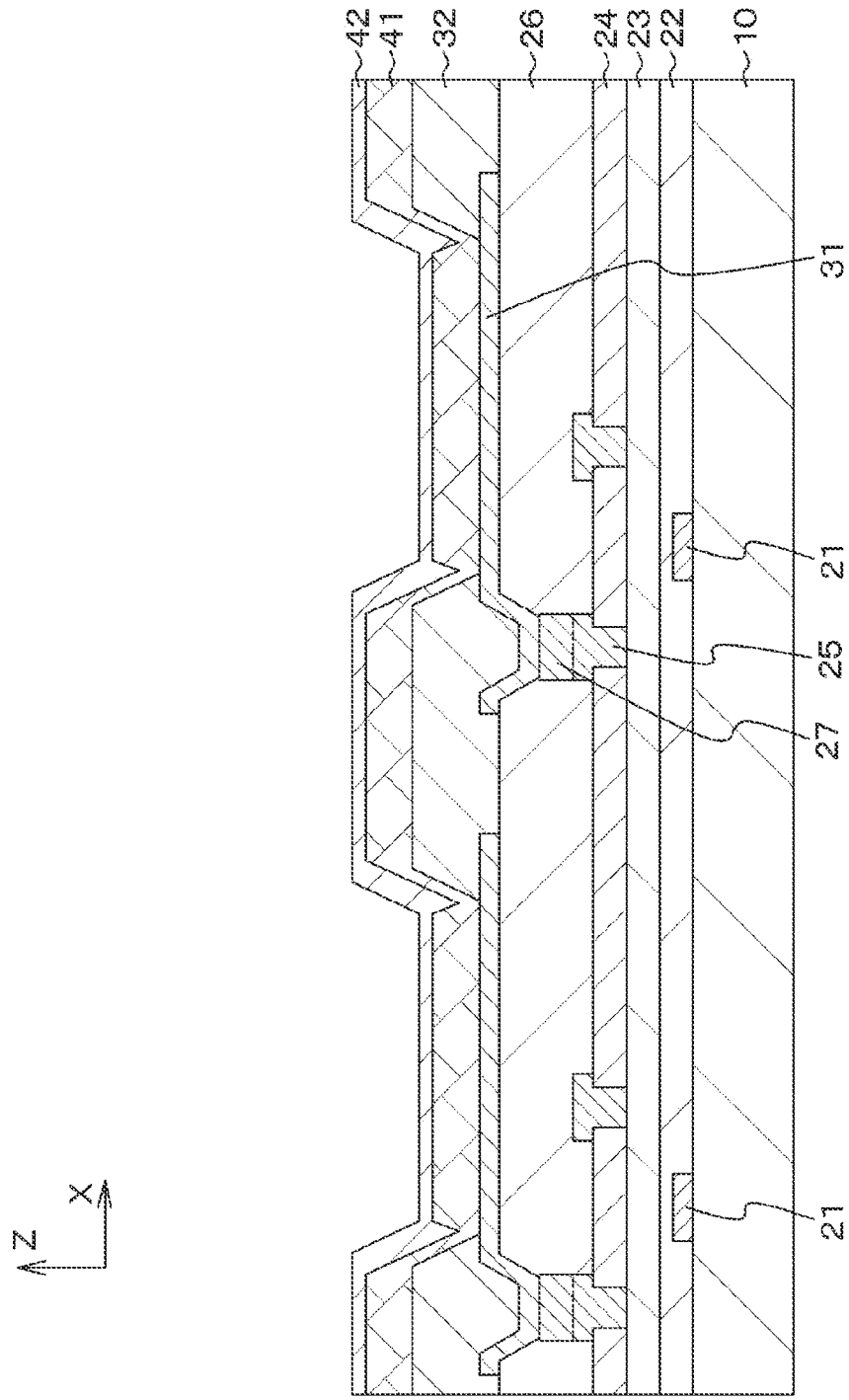
FIG. 11 is a schematic partial end view for explaining the method for manufacturing the display device according to the first embodiment, following FIG. 10.

Thereafter, the material layer 42 is subjected to plasma processing (see FIG. 10). Here, the material layer 42 was subjected to a reverse sputtering process in an argon gas atmosphere. The asking rate at this time becomes relatively low on the slope of the partition wall part 32. As a result, the material layer 42 arranged closest to the second electrode 51 side, among the material layers constituting the organic layer 40, can be formed such that the portion located on the slope of the partition wall part 32 is thicker than the portion located on the first electrode 31 (see FIG. 11).

Figure 12:
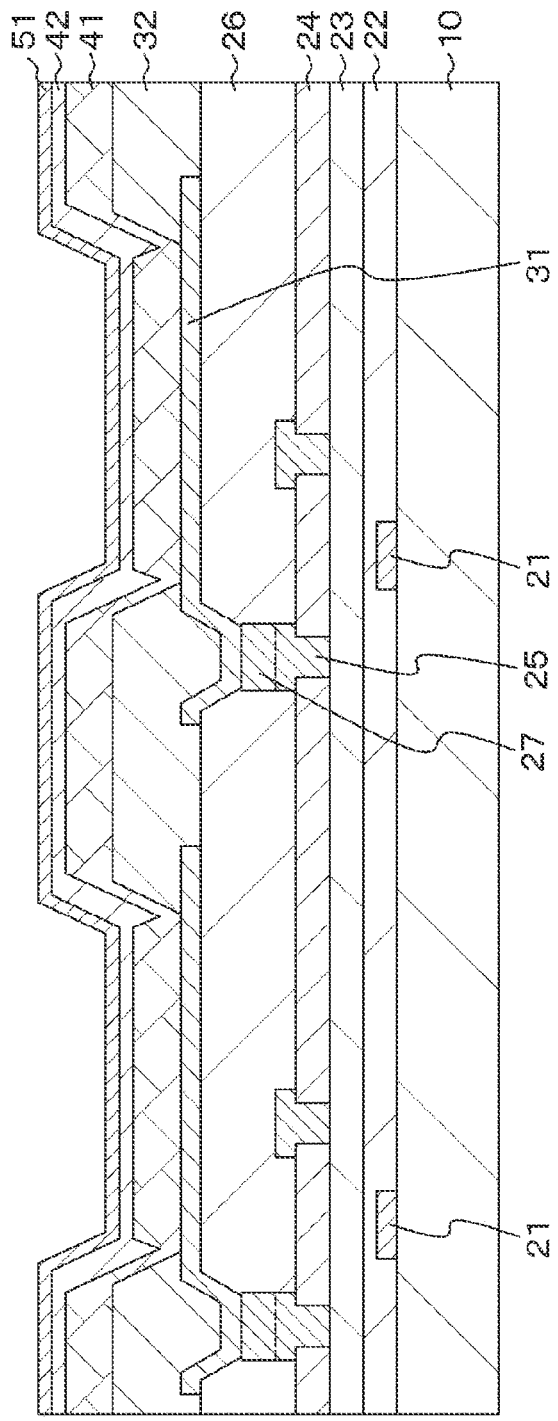
FIG. 12 is a schematic partial end view for explaining the method for manufacturing the display device according to the first embodiment, following FIG. 11.

[Step-130] (See FIG. 12)

Next, the second electrode 51 is formed on the entire surface of the organic layer 40. The second electrode 51 can be obtained by, for example, forming a film including an indium zinc oxide (IZO) over the entire surface by a sputtering method.

[Step-140]

Thereafter, the protective film 61 is formed using, for example, a CVD method. Next, the counter substrate 63 on which the color filter 62 is formed, and the like are pasted as necessary. The display device 1 shown in FIG. 3 can be obtained by the above steps.

Note that In the above description, the organic layer 40 has been described to include the light-emitting layer commonly formed for each first electrode 31, but it is not limited thereto. The organic layer 40 may have a configuration that includes light-emitting layers formed individually for each first electrode.

Second Embodiment

In the first embodiment, the material layer arranged closest to the second electrode side, among the material layers constituting the organic layer, includes an electron transport material. On the other hand, a second embodiment is mainly different in that a configuration of the organic layer is different, that is, in that a material layer arranged closest to the second electrode side includes an electron injection material. More specifically, the material layer arranged closest to the second electrode side includes lithium fluoride.

Figure 13:
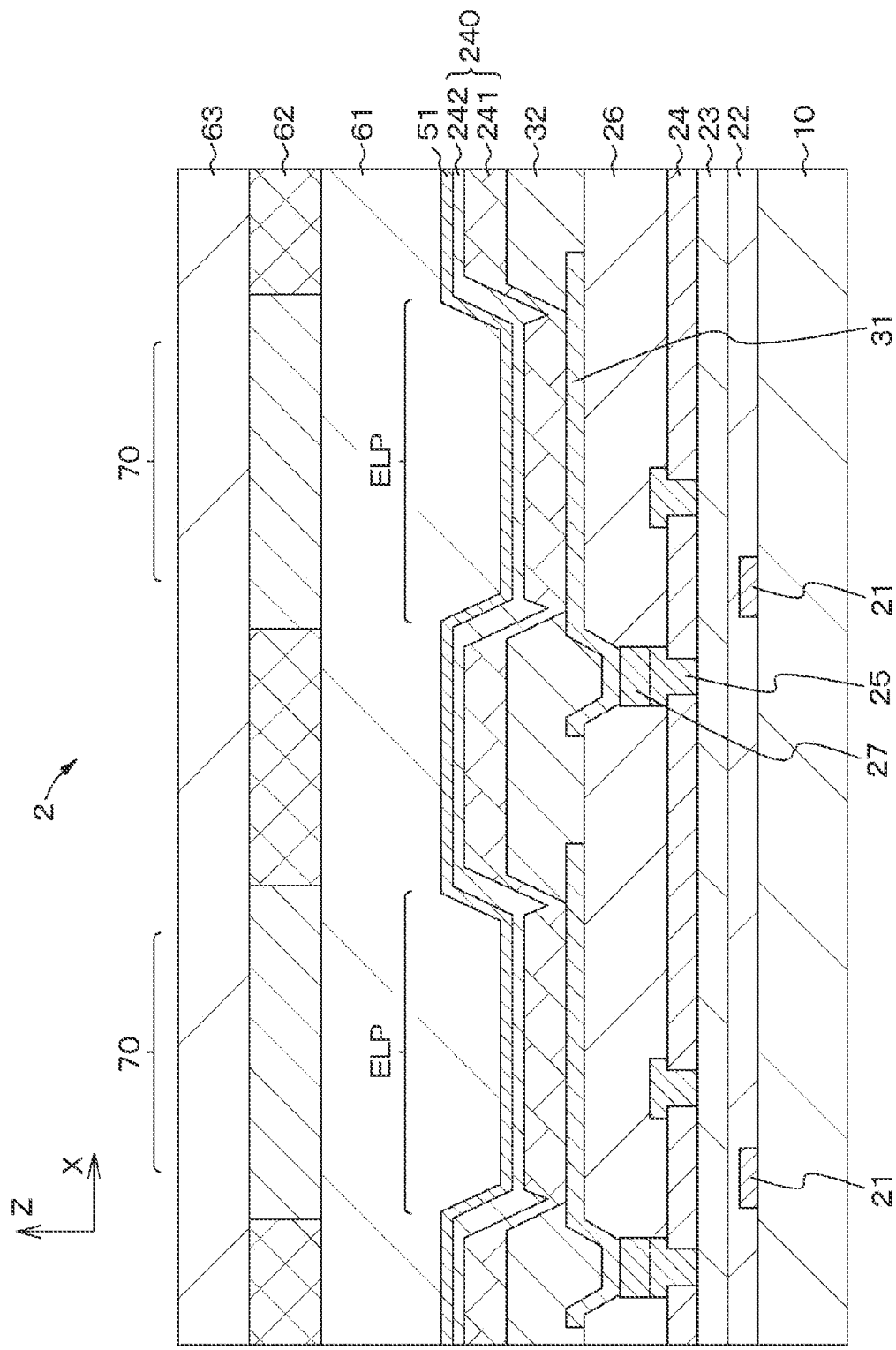
FIG. 13 is a schematic partial cross-sectional view of a portion including a pixel in a display region of a display device according to a second embodiment.

FIG. 13 is a schematic partial cross-sectional view of a display device according to the second embodiment. A schematic plan view of the display device according to the second embodiment can be obtained by replacing the display device 1 with a display device 2 in FIG. 1. The same applies to other embodiments described later.

Also, in the display device 2, an organic layer 240 is formed by laminating a plurality of material layers. In the display device 2, a material layer 242 arranged closest to the second electrode 51 side, among the material layers constituting the organic layer 240, includes lithium fluoride. A reference sign 241 indicates a material layer excluding the material layer 242 in the organic layer 240.

Figure 14:
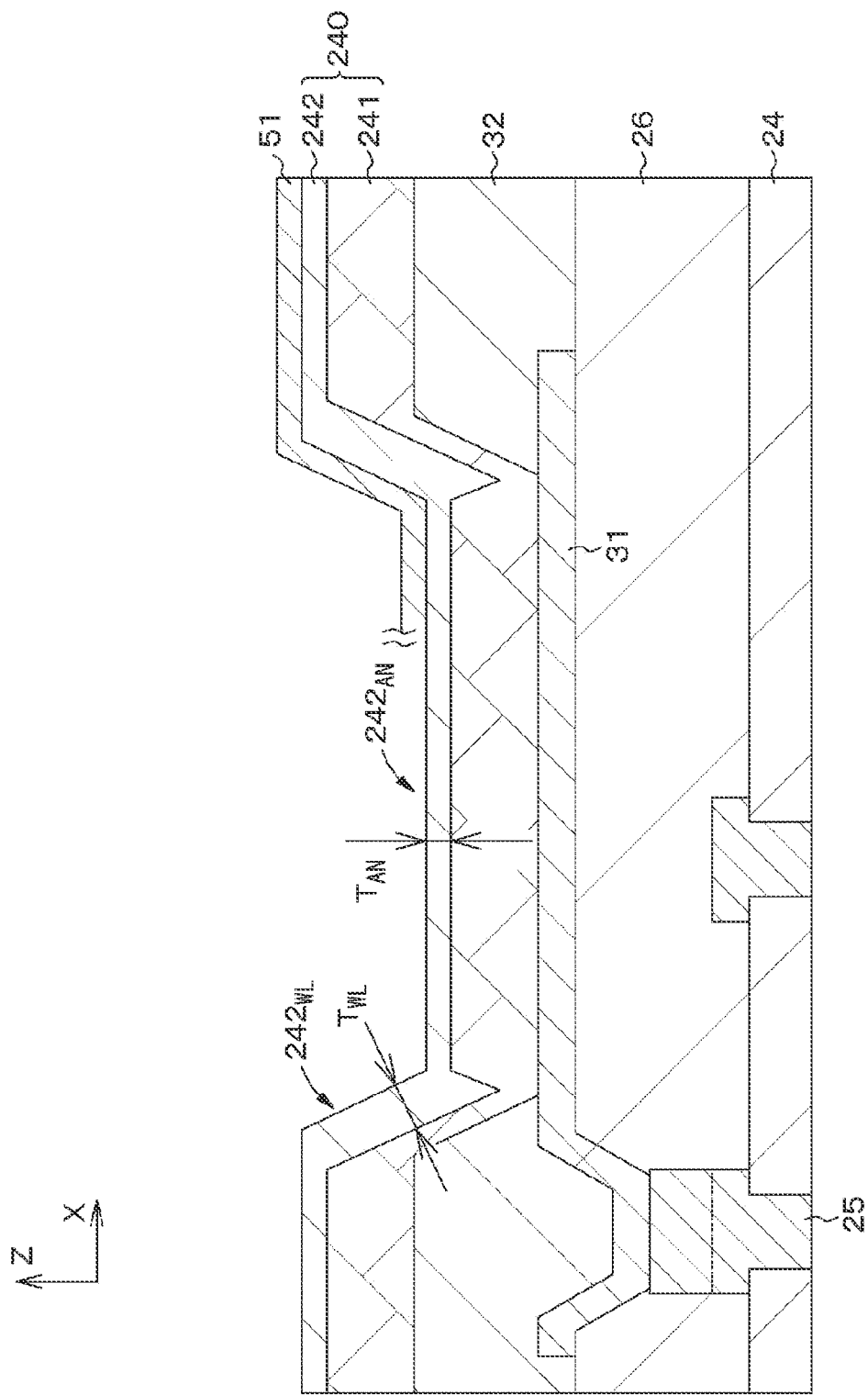
FIG. 14 is a schematic partial cross-sectional view for explaining a film formation configuration of an organic layer.

FIG. 14 is a schematic partial cross-sectional view for explaining a film formation configuration of the organic layer.

The material layer 242 including lithium fluoride is formed such that a portion (indicated by a reference sign $242_{WL}$) located on the slope of the partition wall part 32 is thicker than a portion (indicated by a reference sign $242_{AN}$) located on the first electrode 31. That is, thickness $T_{WL}$ of material layer $242_{WL}$>thickness $T_{AN}$ of material layer $242_{AN}$. As a result, the material layer 242 is constituted such that the resistance of the portion located on the slope of the partition wall part 32 is higher than the resistance of the portion located on the first electrode 31. Therefore, the light emission of the organic layer 240 near the boundary between the partition wall part 32 and the first electrode 31 is suppressed, so that a change in chromaticity in a low luminance state can be reduced.

A method for manufacturing the display device 2 will be described.

[Step-200]

First, the steps similar to those described in the above [Step-100] to [Step-120] are performed to obtain the substrate 10 on which the first electrodes 31 and the partition wall parts 32 are formed (see FIG. 7).

Figure 15:
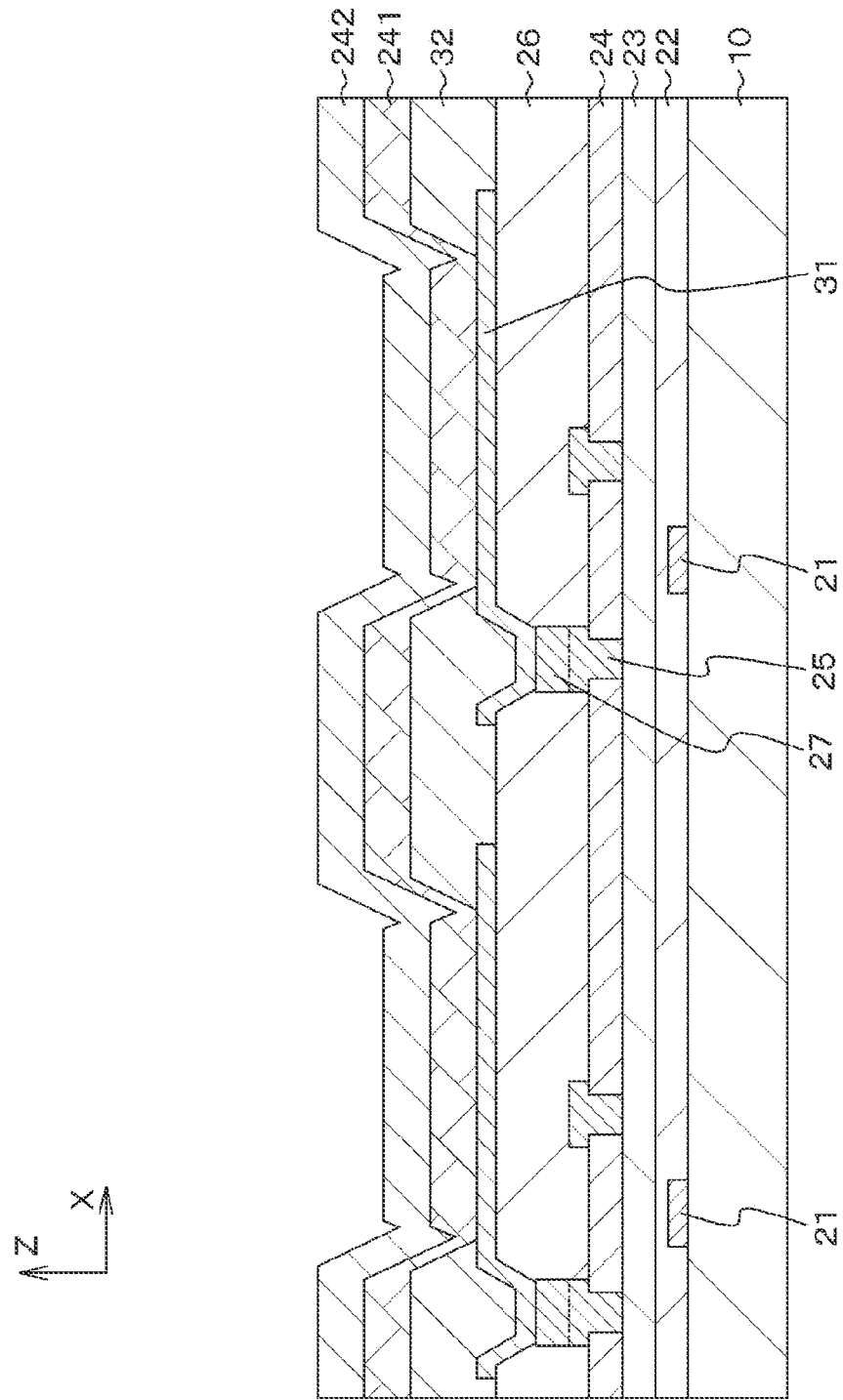
FIG. 15 is a schematic partial end view for explaining a method for manufacturing the display device according to the second embodiment.
Figure 16:
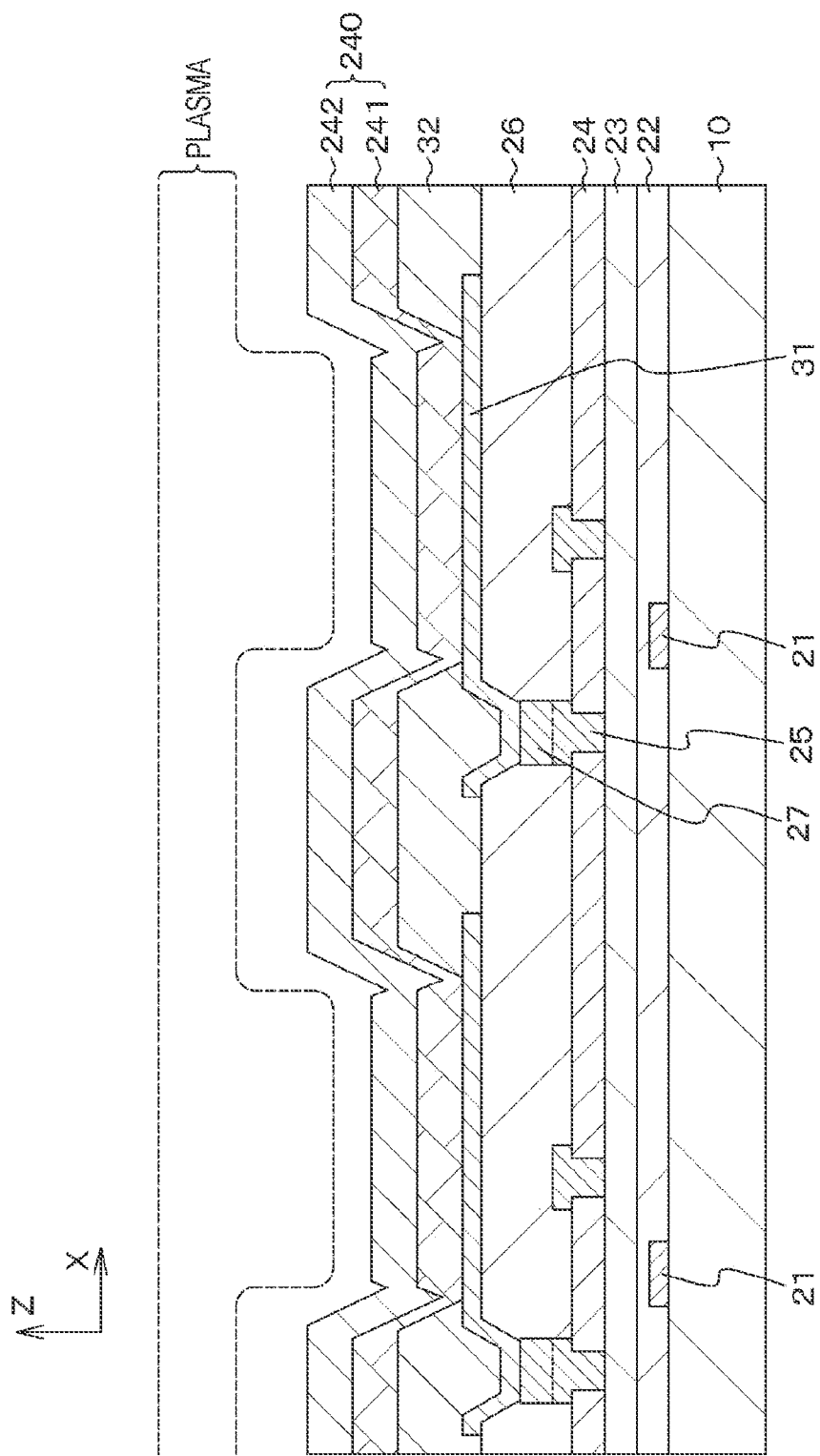
FIG. 16 is a schematic partial end view for explaining the method for manufacturing the display device according to the second embodiment, following FIG. 15.
Figure 17:
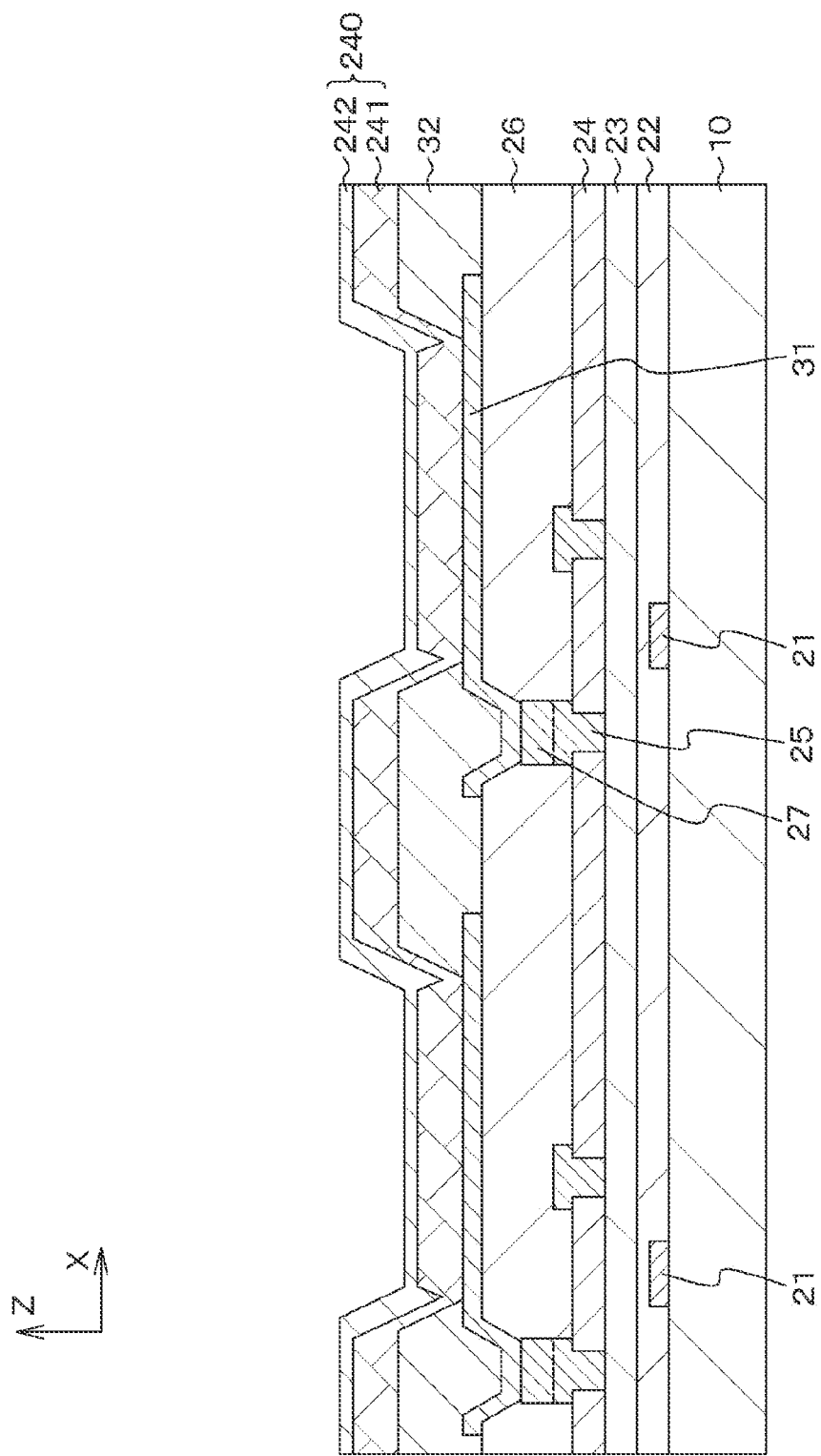
FIG. 17 is a schematic partial end view for explaining the method for manufacturing the display device according to the second embodiment, following FIG. 16.

[Step-210] (See FIGS. 15, 16, and 17)

The organic layer 240 that emits, for example, white light is formed on the entire surface including the surfaces of the first electrodes 31 and the partition wall parts 32. First, for example, a hole injection layer, a hole transport layer, a red light-emitting layer, a light emission separation layer, a blue light-emitting layer, a green light-emitting layer, and an electron transport layer are sequentially formed as the material layer 241 on the first electrode 31 side that excludes the material layer 242. Next, the material layer 242 including an electron injection material is formed on the entire surface (see FIG. 15). At this time, the material layer 242 is formed to be so thick that a sufficient film thickness can be secured on the slope of the partition wall part 32 even after the plasma processing described later.

Thereafter, the material layer 242 is subjected to plasma processing (see FIG. 16). Here, the material layer 242 was subjected to a reverse sputtering process in an argon gas atmosphere. Similarly to what has been described in the first embodiment, the asking rate becomes relatively low on the slope of the partition wall part 32. As a result, the material layer 242 arranged closest to the second electrode 51 side, among the material layers constituting the organic layer 240, can be formed such that the portion located on the slope of the partition wall part 32 is thicker than the portion located on the first electrode 31 (see FIG. 17).

[Step-220]

Subsequently, by performing the steps similar to those described in the above [Step-130] and [Step-140], the display device 2 shown in FIG. 13 can be obtained.

Third Embodiment

A third embodiment is different from the second embodiment in that a material layer arranged closest to the second electrode side includes a co-deposited film of calcium and lithium fluoride.

Figure 18:
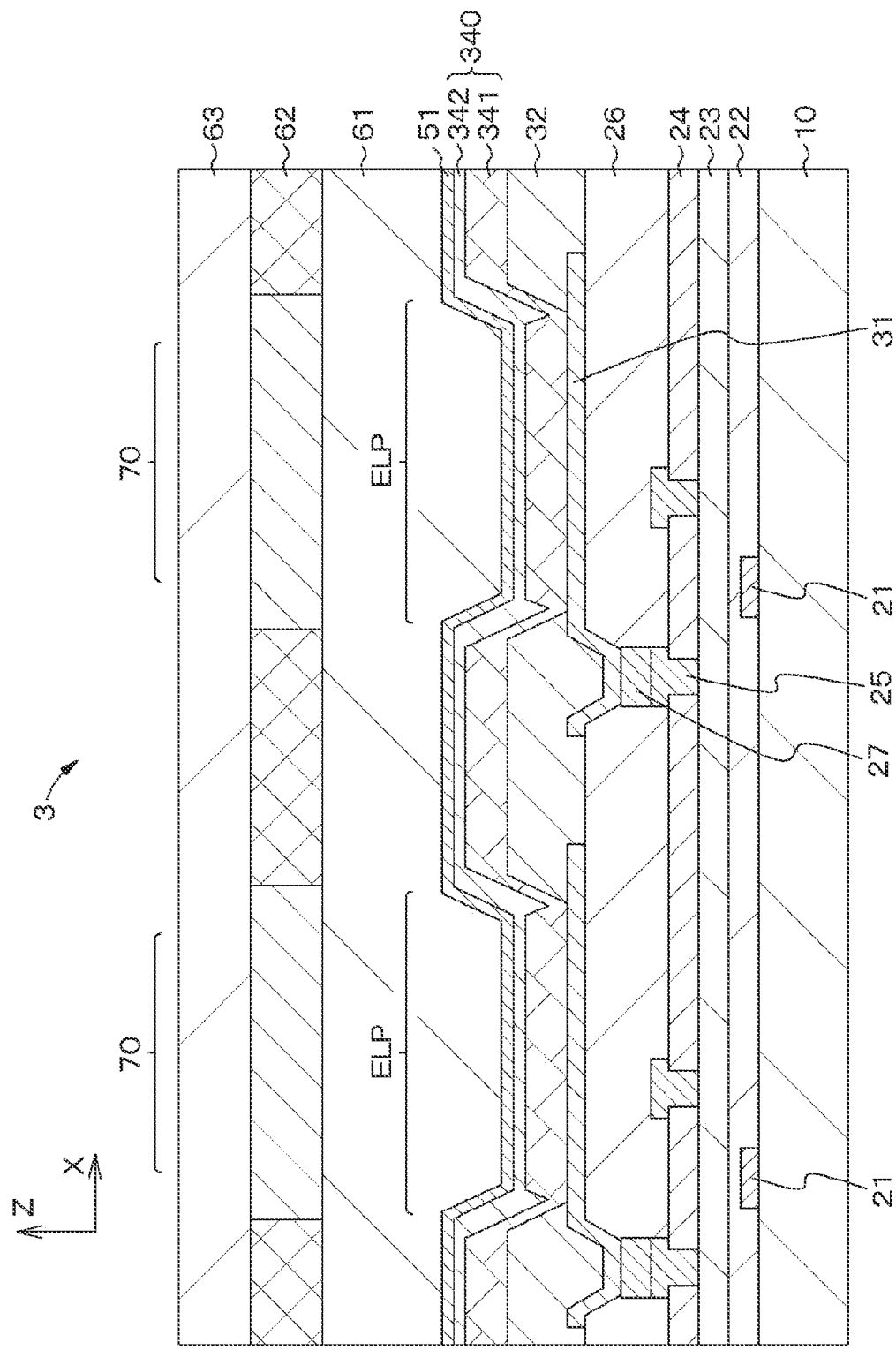
FIG. 18 is a schematic partial cross-sectional view of a portion including a pixel in a display region of a display device according to a third embodiment.

FIG. 18 is a schematic partial cross-sectional view of a display device according to the third embodiment.

Also, in a display device 3, an organic layer 340 is formed by laminating a plurality of material layers. In the display device 3, a material layer 342 arranged closest to the second electrode 51 side, among the material layers constituting the organic layer 340, includes a co-deposited film of calcium and lithium fluoride. A reference sign 341 indicates a material layer excluding the material layer 342 in the organic layer 340.

Figure 19:
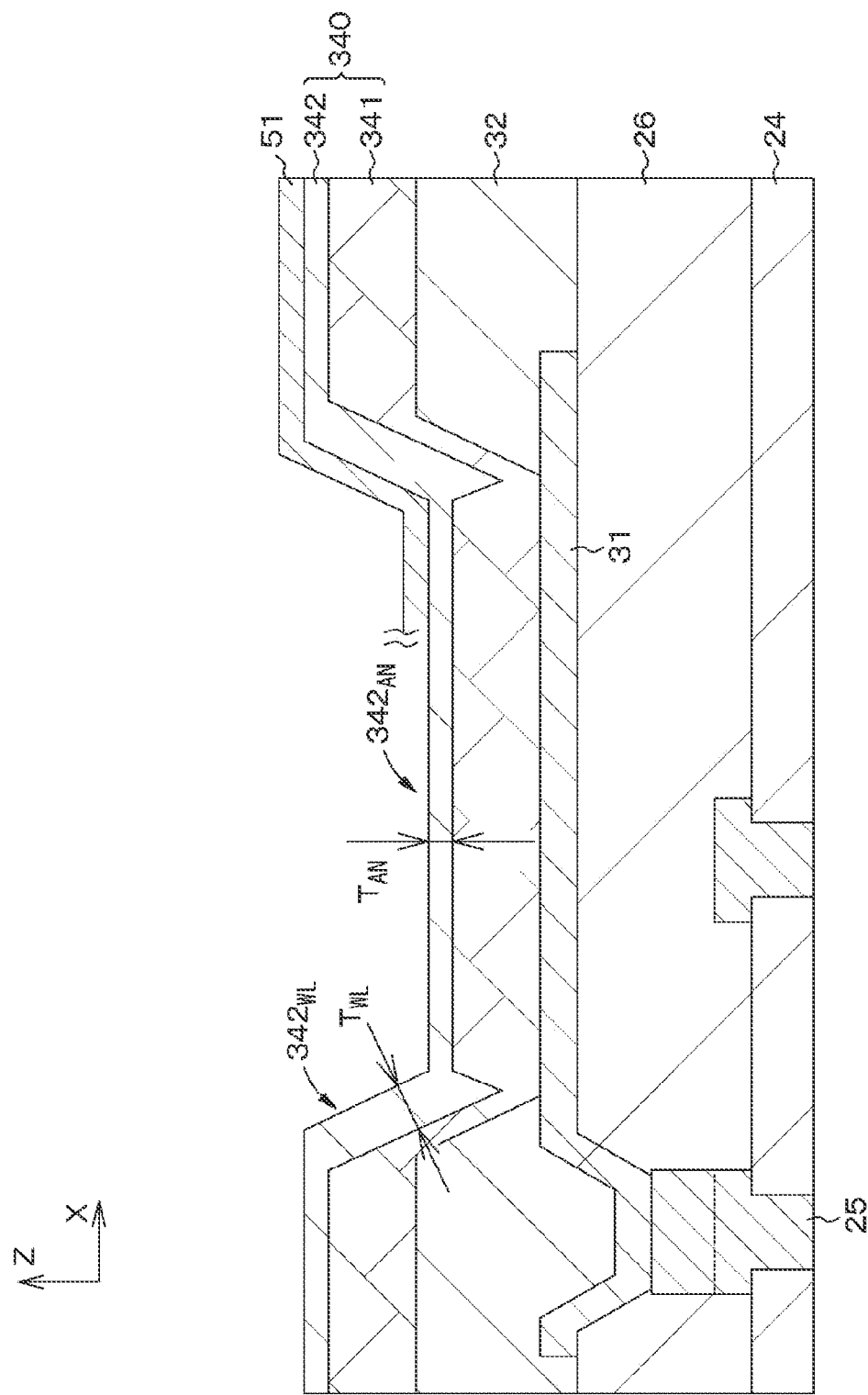
FIG. 19 is a schematic partial cross-sectional view for explaining a film formation configuration of an organic layer.

FIG. 19 is a schematic partial cross-sectional view for explaining a film formation configuration of the organic layer.

The material layer 342 including a co-deposited film of calcium and lithium fluoride is formed such that a portion (indicated by a reference sign $342_{WL}$) located on the slope of the partition wall part 32 is thicker than a portion (indicated by a reference sign $342_{AN}$) located on the first electrode 31. That is, thickness $T_{WL}$ of material layer $342_{WL}$ > thickness $T_{AN}$ of material layer $342_{AN}$. As a result, the material layer 342 is constituted such that a resistance of the portion located on the slope of the partition wall part 32 is higher than a resistance of the portion located on the first electrode 31. Therefore, the light emission of the organic layer 340 near the boundary between the partition wall part 32 and the first electrode 31 is suppressed, so that a change in chromaticity in a low luminance state can be reduced.

A method for manufacturing the display device 3 is similar to the manufacturing method described in the second embodiment except for the composition of the organic layer, so that the description thereof will be omitted.

Fourth Embodiment

A fourth embodiment is a modification of the third embodiment. In the fourth embodiment, the material layer including a co-deposited film of calcium and lithium fluoride is formed such that a concentration of lithium fluoride in the portion located on the slope of the partition wall part is higher than a concentration of lithium fluoride in the portion located on the first electrode. As a result, the portion located on the slope of the partition wall part has a higher resistivity than the portion located on the first electrode.

Figure 20:
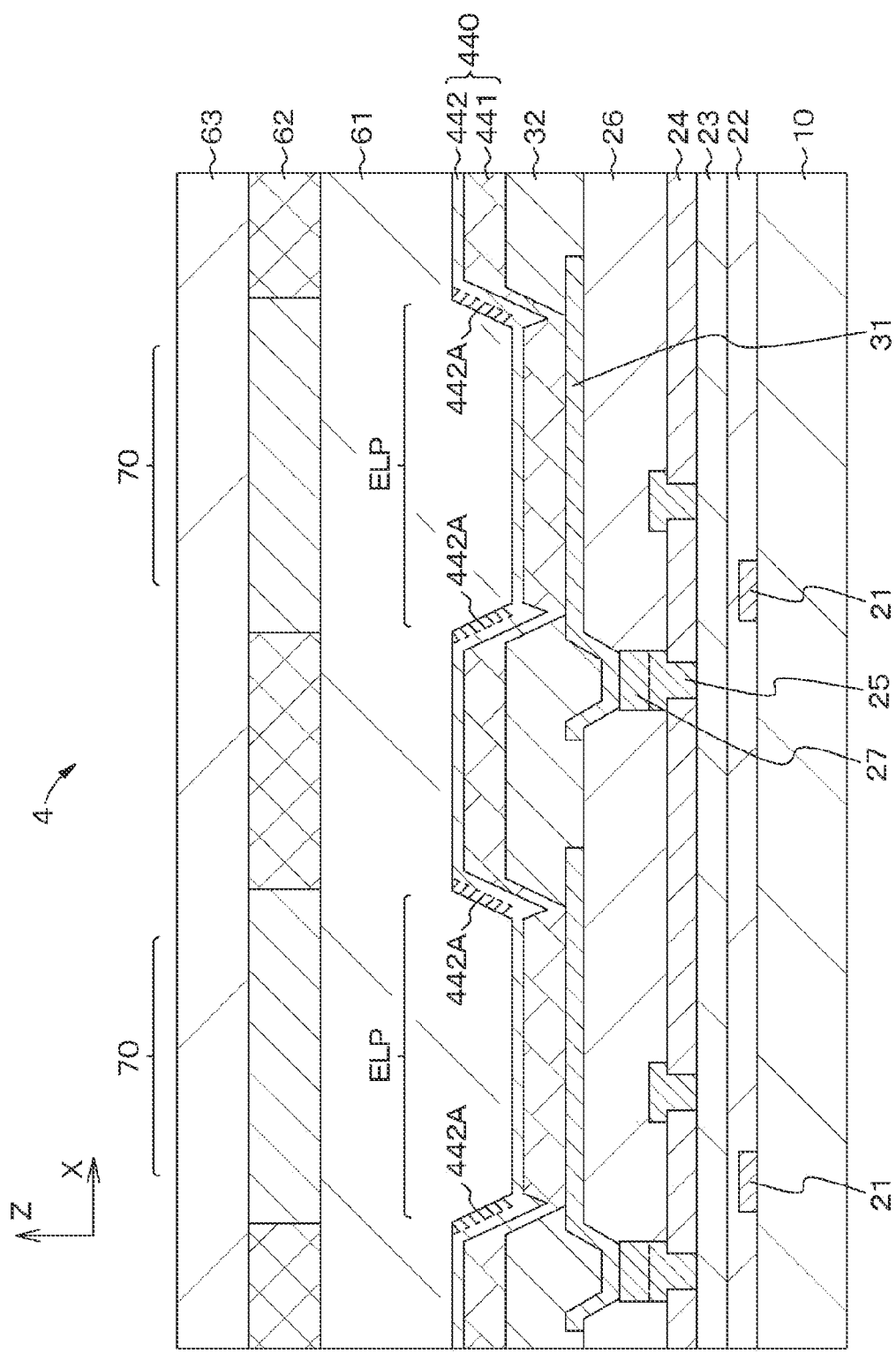
FIG. 20 is a schematic partial cross-sectional view of a portion including a pixel in a display region of a display device according to a fourth embodiment.

FIG. 20 is a schematic partial cross-sectional view of a portion including a pixel in a display region of a display device according to the fourth embodiment.

Also, in a display device 4, an organic layer 440 is formed by laminating a plurality of material layers. Also, in the display device 4, a material layer 442 arranged closest to the second electrode 51 side, among the material layers constituting the organic layer 440, includes lithium fluoride. A reference sign 442A indicates a portion having a high concentration of lithium fluoride. A reference sign 441 indicates a material layer excluding the material layer 442 in the organic layer 440.

Figure 21:
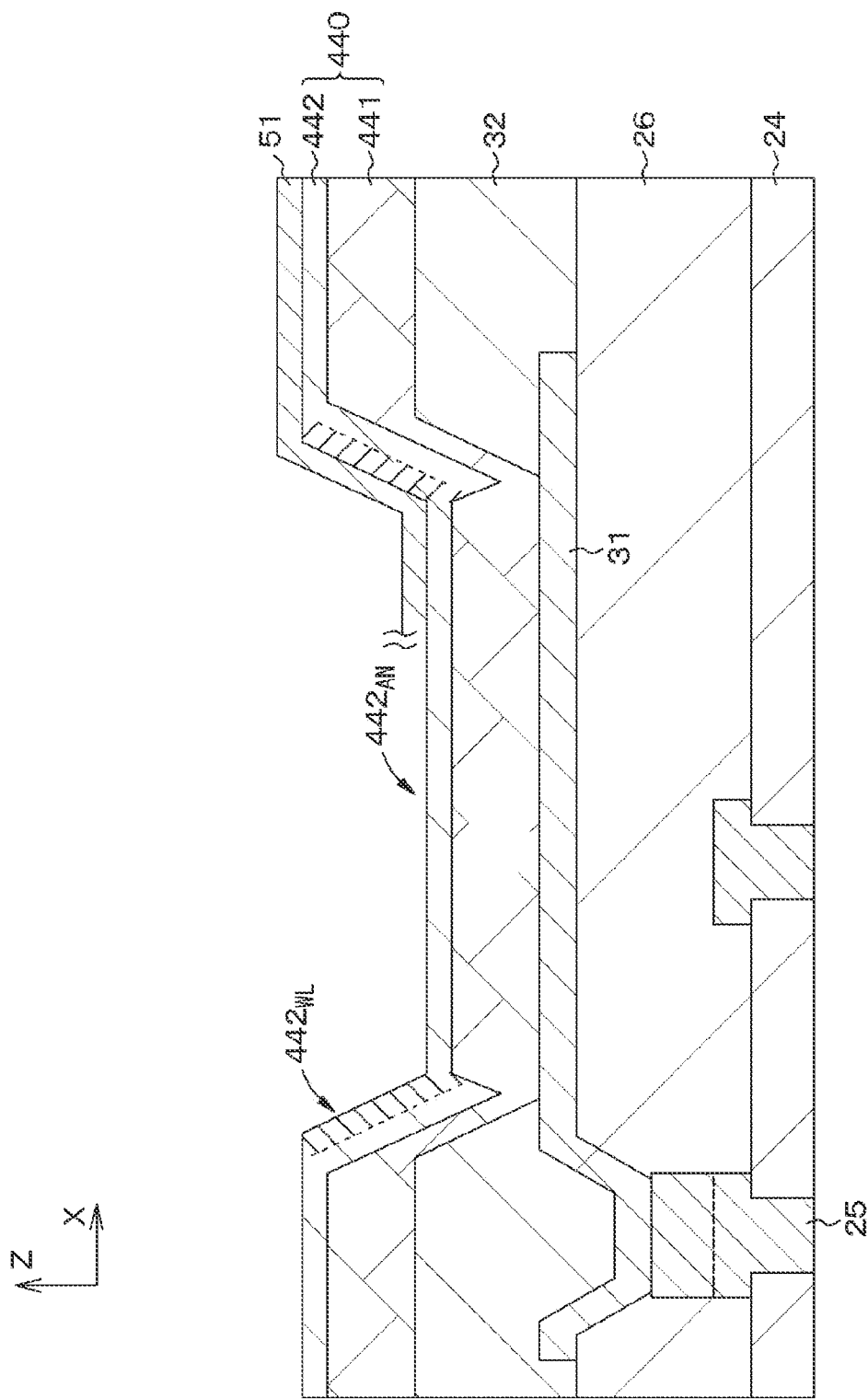
FIG. 21 is a schematic partial cross-sectional view for explaining a film formation configuration of an organic layer.

FIG. 21 is a schematic partial cross-sectional view for explaining a film formation configuration of the organic layer.

The material layer 442 including a co-deposited film of calcium and lithium fluoride is formed such that the concentration of lithium fluoride in a portion (indicated by a reference sign $442_{WL}$) located on the slope of the partition wall part 32 is higher than the concentration of lithium fluoride in a portion (indicated by a reference sign $442_{AN}$) located on the first electrode 31. As a result, the light emission of the organic layer 440 near the boundary between the partition wall part 32 and the first electrode 31 is suppressed, so that a change in chromaticity in a low luminance state can be reduced.

A method for manufacturing the display device 4 will be described.

[Step-400]

First, the steps similar to those described in the above [Step-100] to [Step-120] are performed to obtain the substrate 10 on which the first electrodes 31 and the partition wall parts 32 are formed (see FIG. 7).

Figure 22:
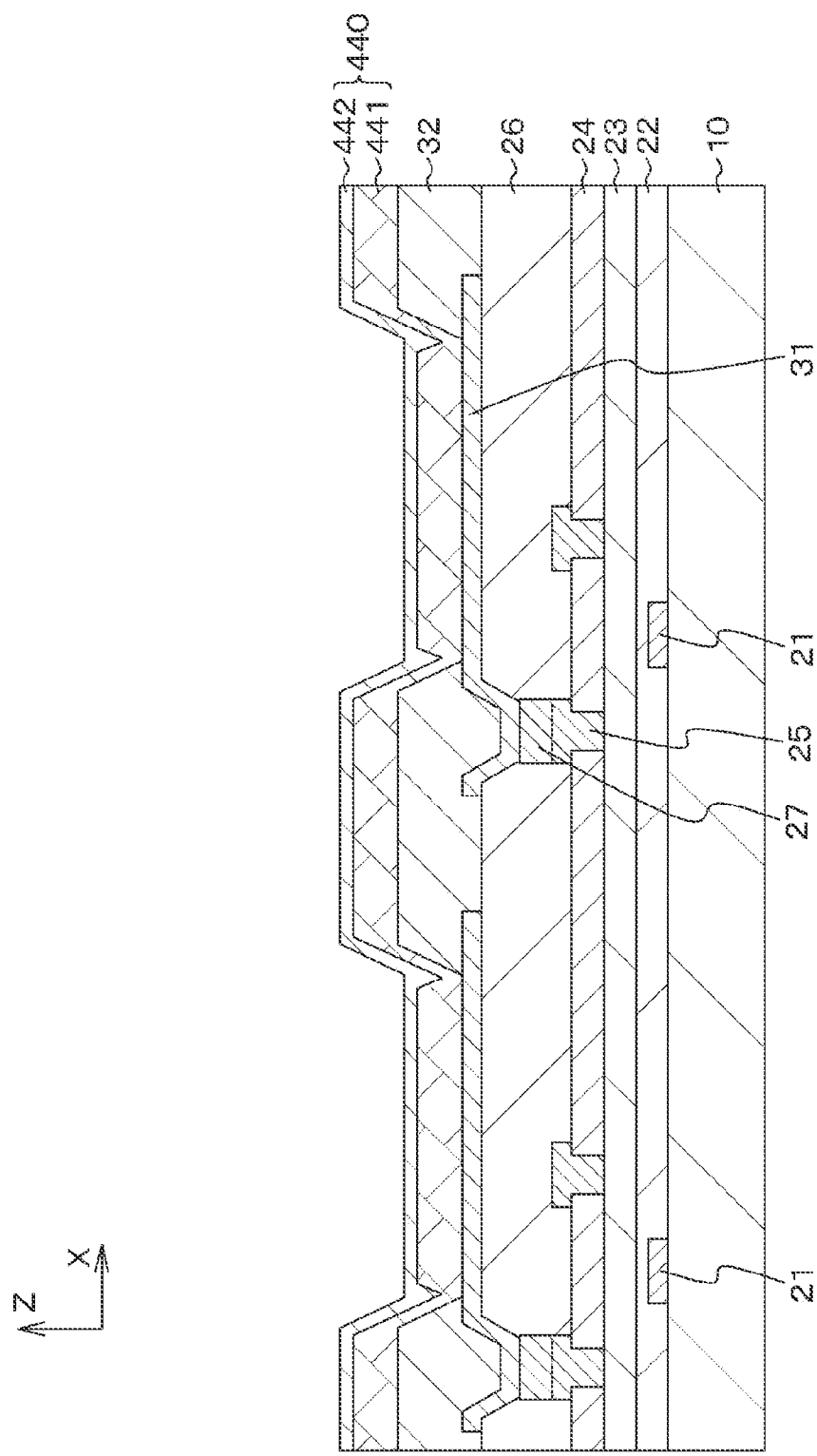
FIG. 22 is a schematic partial end view for explaining a method for manufacturing the display device according to the fourth embodiment.
Figure 23:
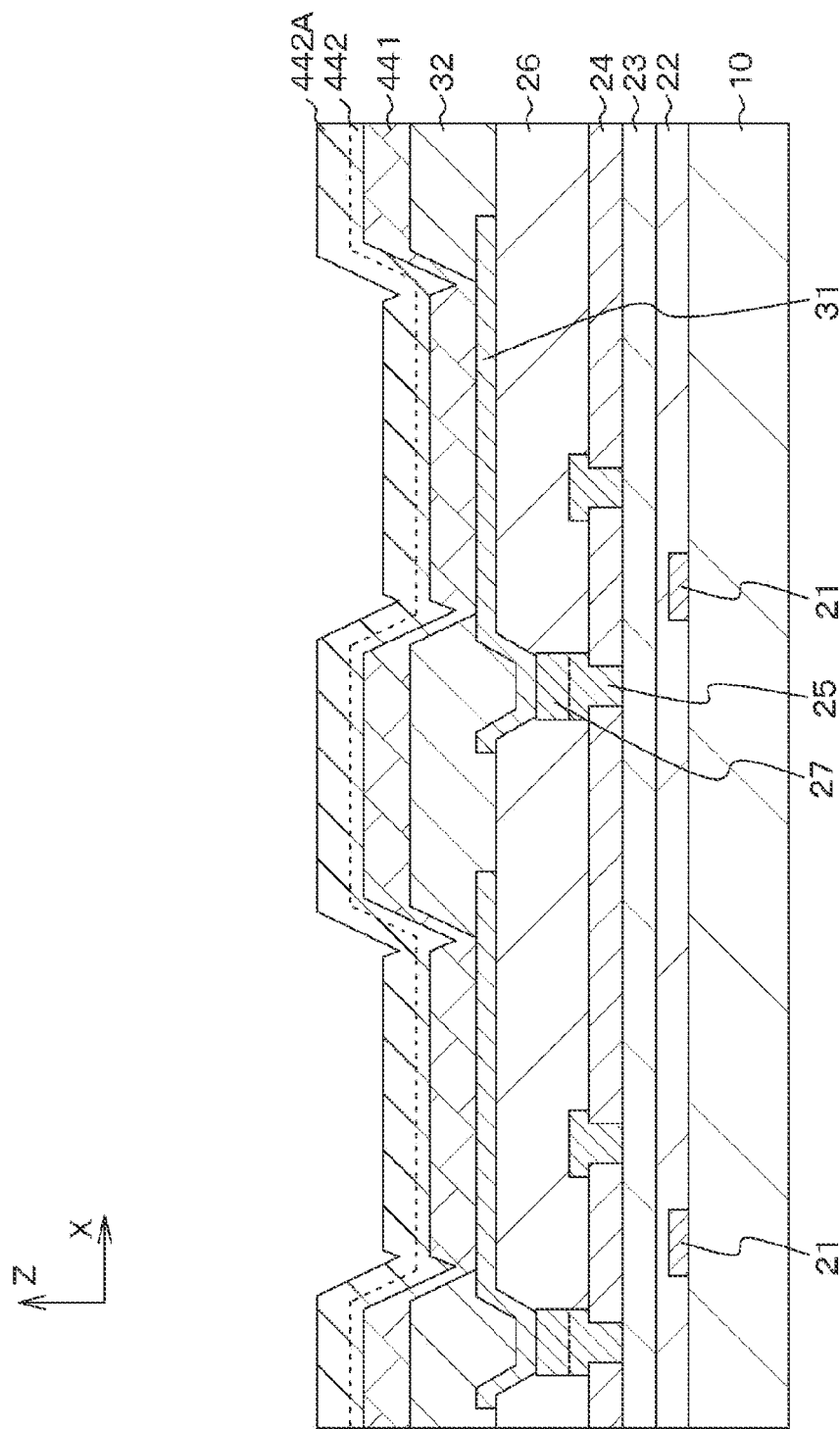
FIG. 23 is a schematic partial end view for explaining the method for manufacturing the display device according to the fourth embodiment, following FIG. 22.
Figure 24:
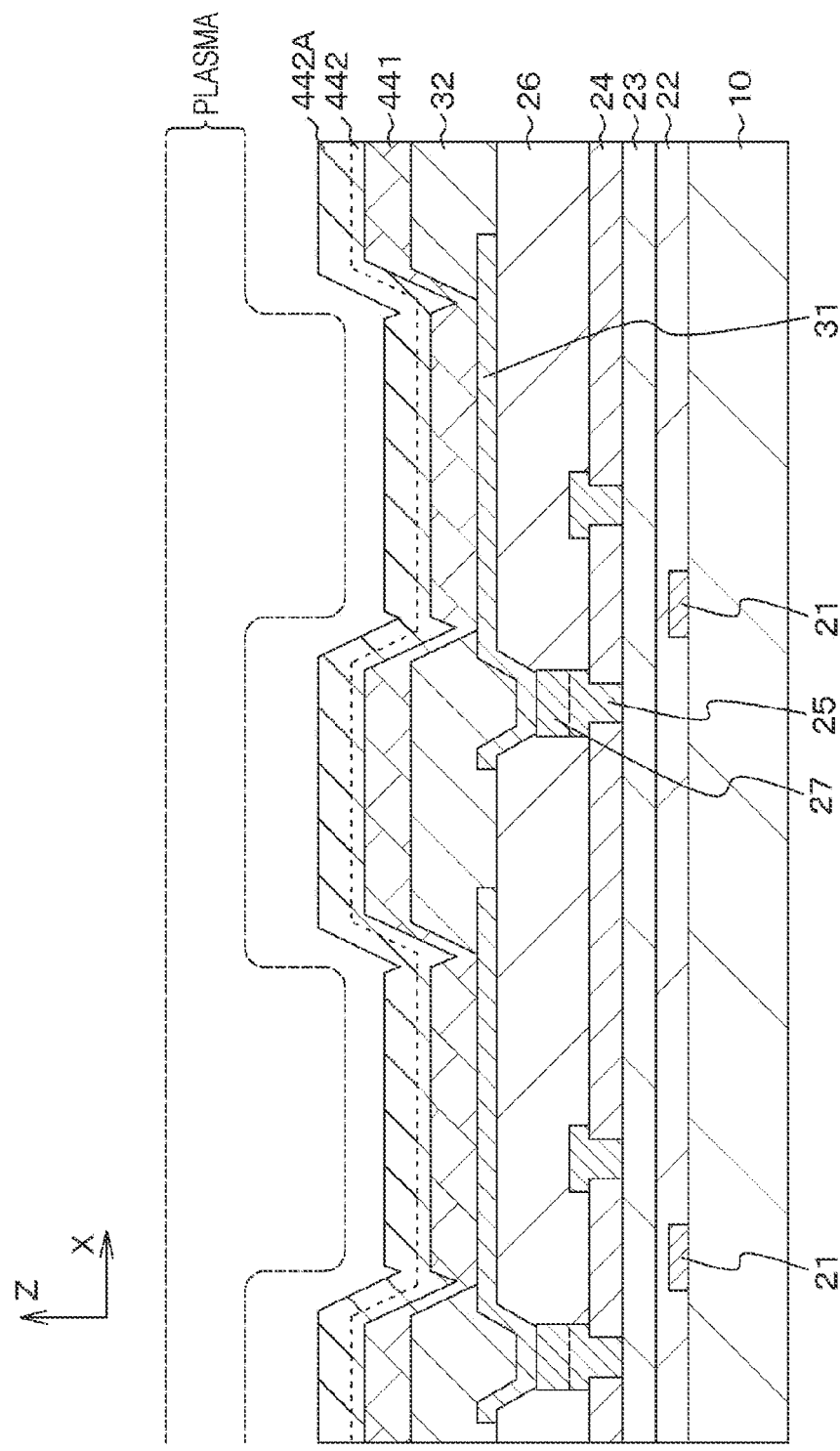
FIG. 24 is a schematic partial end view for explaining the method for manufacturing the display device according to the fourth embodiment, following FIG. 23.

[Step-410] (See FIGS. 22, 23, and 24)

The organic layer 440 that emits, for example, white light is formed on the entire surface including the surfaces of the first electrodes 31 and the partition wall parts 32. First, for example, a hole injection layer, a hole transport layer, a red light-emitting layer, a light emission separation layer, a blue light-emitting layer, a green light-emitting layer, and an electron transport layer are sequentially formed as a material layer 441 on the first electrode 31 side that excludes the material layer 442. Next, the material layer 442 including a co-deposited film of calcium and lithium fluoride is formed on the entire surface (see FIG. 22). Then, co-deposition is subsequently performed on the entire surface so as to increase a concentration of lithium fluoride (see FIG. 23). A reference sign 442A indicates a portion of the co-deposited film having a high concentration of lithium fluoride. Note that In the view, the difference in concentration was shown by changing the thickness of the hatching.

Figure 25:
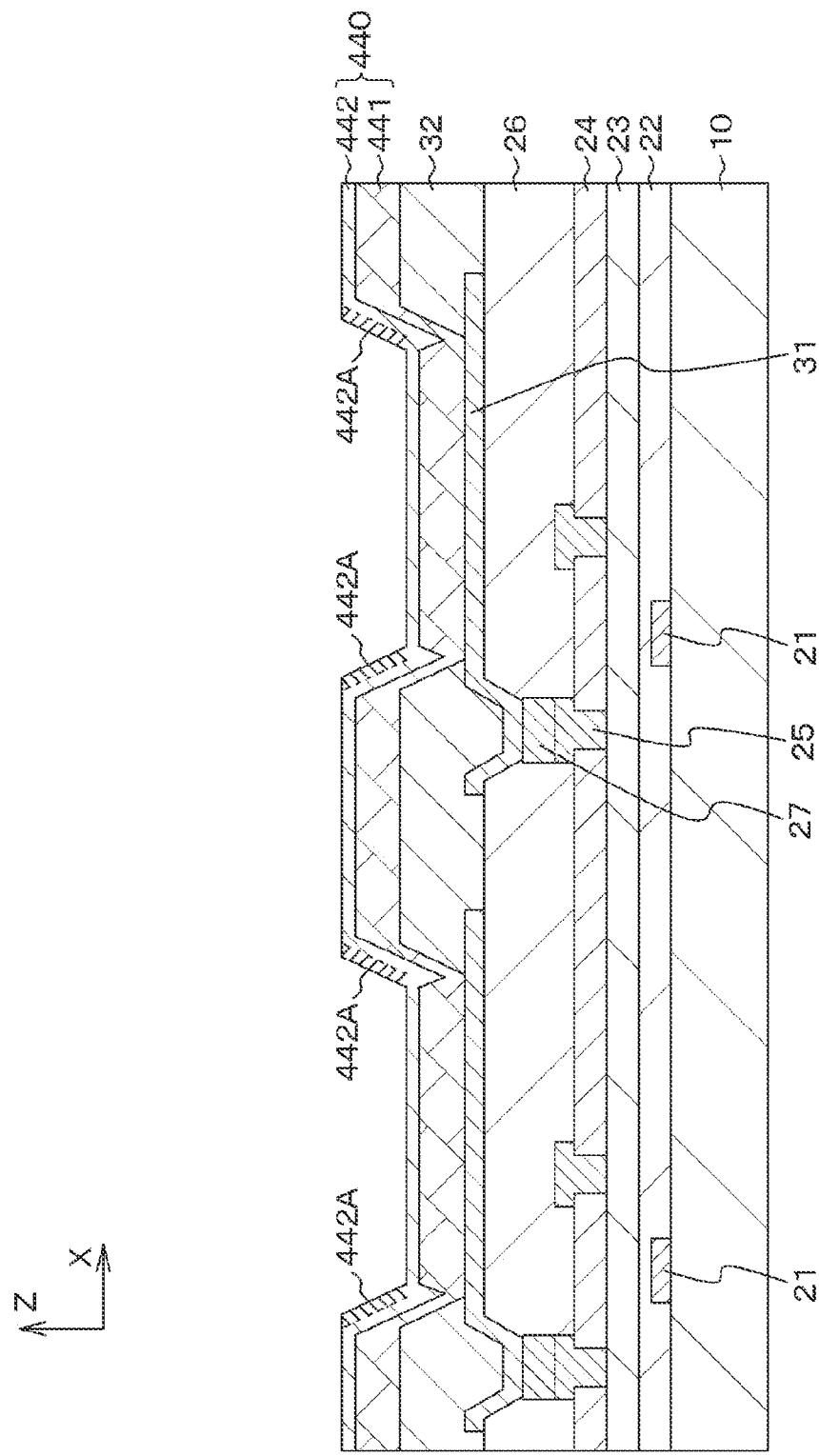
FIG. 25 is a schematic partial end view for explaining the method for manufacturing the display device according to the fourth embodiment, following FIG. 24.

Thereafter, the material layer 442 is subjected to plasma processing (see FIG. 24). Here, the material layer 442 was subjected to a reverse sputtering process in an argon gas atmosphere. Similarly to what has been described in the first embodiment, the asking rate becomes relatively low on the slope of the partition wall part 32. As a result, a larger amount of the material layer 442A remains on the slope of the partition wall part 32 (see FIG. 25). As a result, in the material layer 442, the concentration of lithium fluoride in the portion located on the slope of the partition wall part 32 is higher than the concentration of lithium fluoride in the portion located on the first electrode 31.

[Step-420]

Subsequently, by performing the steps similar to those described in the above [Step-130] and [Step-140], the display device 4 shown in FIG. 20 can be obtained.

Note that in the above description, an aspect has been described in which the concentration of lithium fluoride in the material layer 442 changes stepwise in [Step-410], but the present disclosure is not limited thereto. The concentration of lithium fluoride in the material layer 442 including a co-deposited film may, for example, be continuously increased.

According to the various display devices according to the present disclosure described above, the material layer arranged closest to the second electrode side, among the plurality of material layers constituting the organic layer, is formed such that the resistance value of the portion located on the slope of the partition wall part is higher than the resistance value of the portion located on the first electrode. Therefore, the organic layer near the boundary between the partition wall part and the first electrode becomes difficult to emit light, so that a phenomenon that chromaticity changes in a low luminance state is reduced.

[Electronic Apparatus]

The display devices of the present disclosure described above can be used as a display unit (display device) of an electronic apparatus in any field that displays a video signal input to the electronic apparatus or a video signal generated in the electronic apparatus as an image or a video. As an example, they can be used as a display unit of, for example, a television set, a digital still camera, a notebook personal computer, a mobile terminal device such as a mobile phone, a video camera, a head-mounted display (head-mounted type display), or the like.

The display devices of the present disclosure also include a module type having a sealed configuration. As an example, a display module formed by pasting a counter part, such as transparent glass, to the pixel array part is mentioned. Note that the display module may be provided with a circuit part for inputting and outputting signals and the like between the outside and the pixel array part, a flexible printed circuit (FPC), or the like. Hereinafter, a digital still camera and a head-mounted display will be described as specific examples of the electronic apparatus using the display device of the present disclosure. However, the specific examples described here are merely examples, and the present disclosure is not limited thereto.

Specific Example 1

Figure 26A:
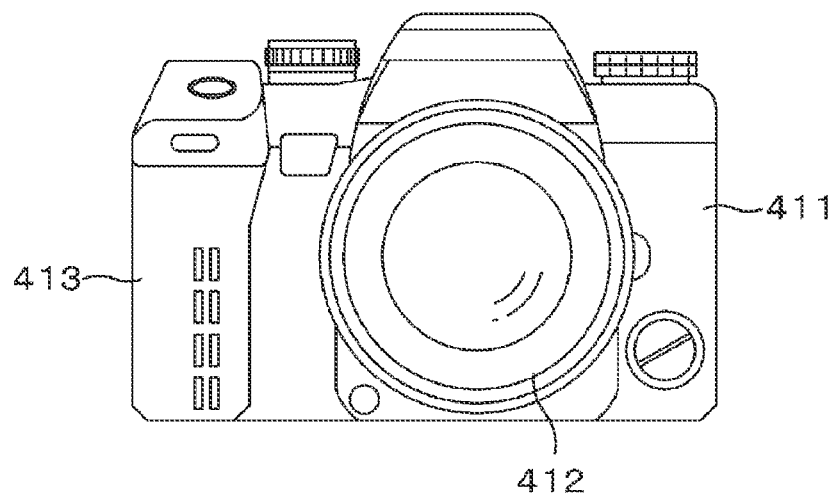
Figure 26B:
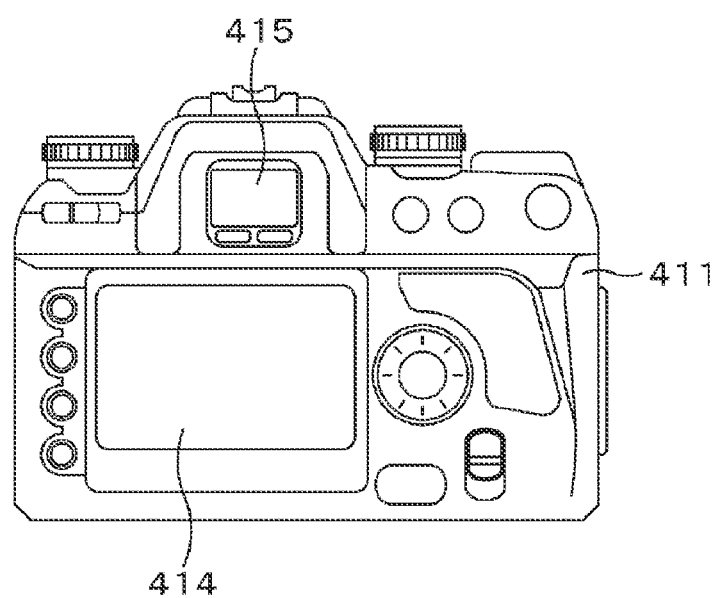

FIGS. 26A and 26B are external views of an interchangeable lens single-lens reflex type digital still camera, in which FIG. 26A shows a front view thereof and FIG. 26B shows a rear view thereof. The interchangeable lens single-lens reflex type digital still camera includes, for example, an interchangeable imaging lens unit (interchangeable lens) 412 on the front right side of a camera main body part (camera body) 411, and a grip part 413 that a photographer holds on the front left side.

Then, a monitor 414 is provided substantially at the center of the rear surface of the camera body part 411. A viewfinder (eyepiece window) 415 is provided above the monitor 414. By looking into the viewfinder 415, the photographer can visually recognize the optical image of a subject guided from the imaging lens unit 412 and determine a composition.

In the interchangeable lens single-lens reflex type digital still camera having the above configuration, the display device of the present disclosure can be used as the viewfinder 415. That is, the interchangeable lens single-lens reflex type digital still camera according to the present example is manufactured by using the display device of the present disclosure as the viewfinder 415.

Specific Example 2

Figure 27:
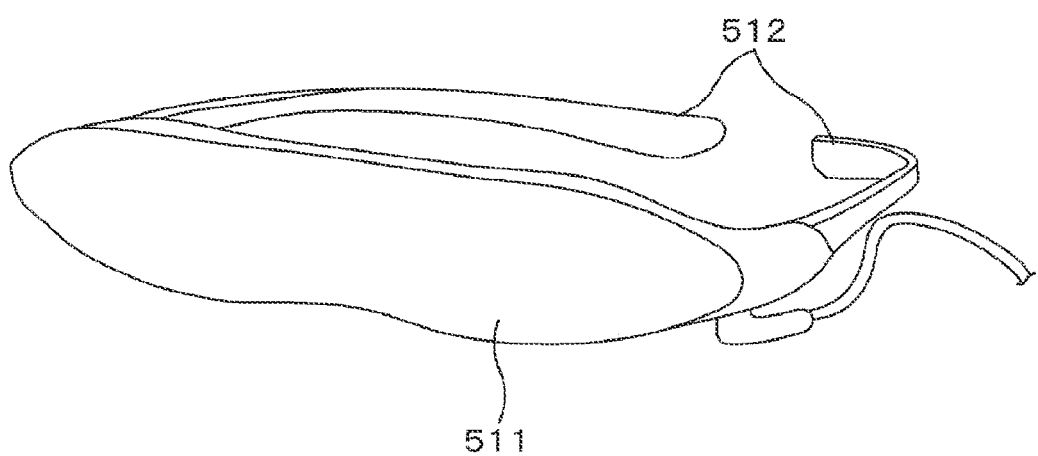
FIG. 27 is an external view of a head-mounted display.

FIG. 27 is an external view of a head-mounted display. The head-mounted display includes, for example, ear hooking parts 512 that a user wears on the head on both sides of an eyeglass-shaped display unit 511. In the head-mounted display, the display device of the present disclosure can be used as the display unit 511. That is, the head-mounted display according to the present example is manufactured by using the display device of the present disclosure as the display unit 511.

Specific Example 3

Figure 28:
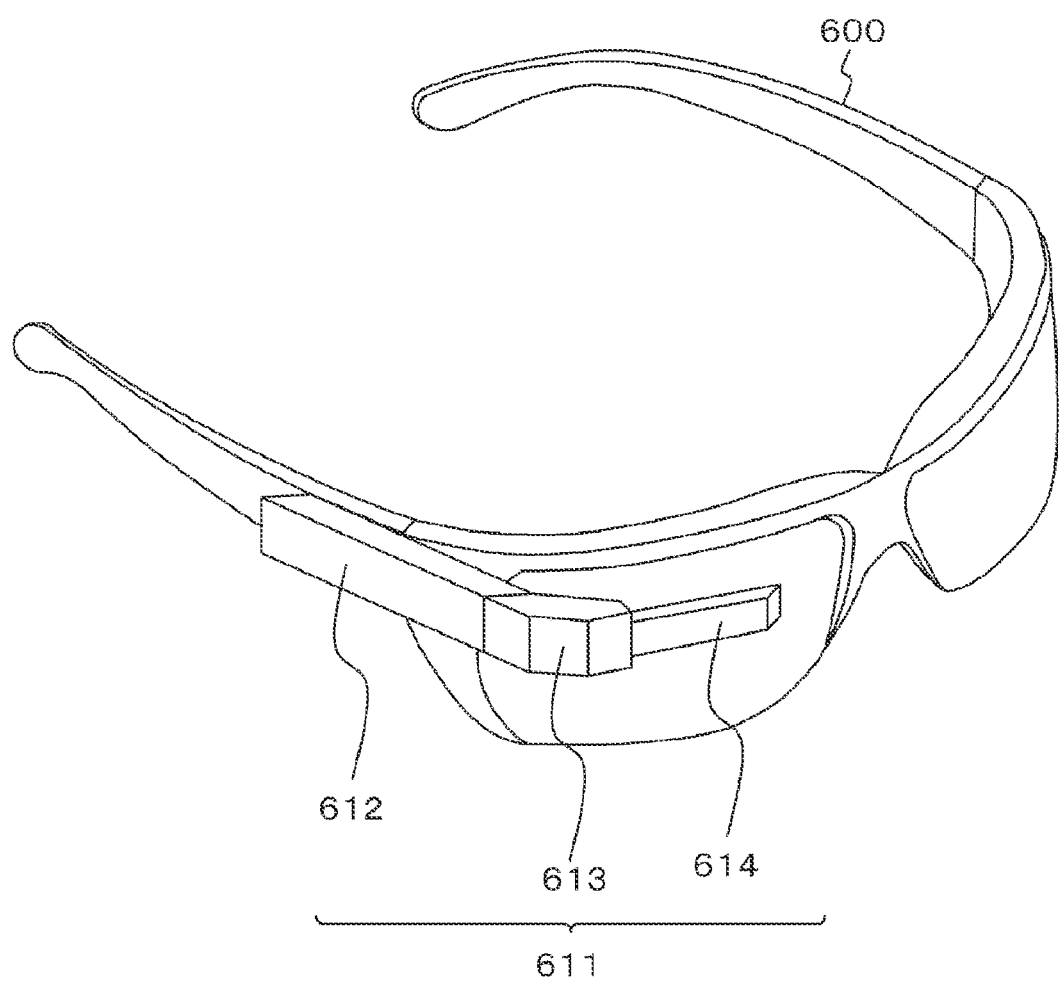
FIG. 28 is an external view of a see-through head-mounted display.

FIG. 28 is an external view of a see-through head-mounted display. A see-through head-mounted display 611 includes a main body part 612, an arm 613, and a lens barrel 614.

The main body part 612 is connected to the arm 613 and glasses 600. Specifically, an end in the long side direction of the main body part 612 is coupled to the arm 613, and one of the side surfaces of the main body part 612 is coupled to the glasses 600 via a connecting member. Note that the main body part 612 may be directly mounted on the head of a human body.

The main body part 612 incorporates a control board for controlling the operation of the see-through head-mounted display 611 and a display unit. The arm 613 connects the main body part 612 and the lens barrel 614 and supports the lens barrel 614. Specifically, the arm 613 is coupled to each of the end of the main body part 612 and the end of the lens barrel 614, and fixes the lens barrel 614. Furthermore, the arm 613 incorporates a signal line for communicating data related to an image provided from the main body part 612 to the lens barrel 614.

The lens barrel 614 projects, through an eyepiece, image light provided from the main body part 612 via the arm 613 toward the eyes of the user wearing the see-through head-mounted display 611. In the see-through head-mounted display 611, the display device of the present disclosure can be used for the display unit of the main body part 612.

[Others]

Note that the technology of the present disclosure can also have the following configurations.

[A1]

A display device including:

first electrodes formed to be arranged in a two-dimensional matrix on a substrate;

a partition wall part provided between the first electrodes adjacent to each other and having a cross-sectional shape whose width decreases as it moves away from the substrate;

an organic layer formed on an entire surface including surfaces of the first electrodes and the partition wall parts and formed by laminating a plurality of material layers; and a second electrode formed on an entire surface including a surface of the organic layer, in which among the plurality of material layers constituting the organic layer, a material layer arranged closest to the second electrode side is formed such that a resistance of a portion located on a slope of the partition wall part is higher than a resistance of a portion located on the first electrode.

[A2]

The display device according to [A1], in which among the material layers constituting the organic layer, the material layer arranged closest to the second electrode side is formed such that the portion located on the slope of the partition wall part is thicker than the portion located on the first electrode.

[A3]

The display device according to [A1], in which among the material layers constituting the organic layer, the material layer arranged closest to the second electrode side is formed such that the portion located on the slope of the partition wall part has a higher resistivity than the portion located on the first electrode.

[A4]

The display device according to any one of [A1] to [A3], in which among the material layers constituting the organic layer, the material layer arranged closest to the second electrode side includes an electron transport material or an electron injection material.

[A5]

The display device according to any one of [A4], in which among the material layers constituting the organic layer, the material layer arranged closest to the second electrode side includes lithium fluoride.

[A6]

The display device according to any one of [A5], in which the material layer including lithium fluoride is formed such that the portion located on the slope of the partition wall part is thicker than the portion located on the first electrode.

[A7]

The display device according to [A4], in which among the material layers constituting the organic layer, the material layer arranged closest to the second electrode side includes a co-deposited film of calcium and lithium fluoride.

[A8]

The display device according to [A7], in which the material layer including the co-deposited film of calcium and lithium fluoride is formed such that the portion located on the slope of the partition wall part is thicker than the portion located on the first electrode.

[A9]

The display device according to [A8], in which the material layer including the co-deposited film of calcium and lithium fluoride is formed such that the portion located on the slope of the partition wall part has a higher resistivity than the portion located on the first electrode by being formed such that a concentration of lithium fluoride in the portion located on the slope of the partition wall part is higher than a concentration of lithium fluoride in the portion located on the first electrode.

[A10]

The display device according to any one of [A1] to [A9], in which the organic layer includes a light-emitting layer formed in common for each first electrode.

[A11]

The display device according to any one of [A1] to [A9], in which the organic layer includes a light-emitting layer formed individually for each first electrode.

[B1]

A method for manufacturing a display device including steps of:
  forming first electrodes by arranging them in a two-dimensional matrix on a substrate;
  providing, between the first electrodes adjacent to each other, a partition wall part having a cross-sectional shape whose width decreases as it moves away from the substrate;
  forming, on an entire surface including surfaces of the first electrodes and the partition wall parts, an organic layer by laminating a plurality of material layers; and
  forming a second electrode on an entire surface including a surface of the organic layer,
  in which in the step of forming the organic layer,
  a material layer arranged closest to the second electrode side, among the material layers constituting the organic layer, is formed such that a resistance of a portion located on a slope of the partition wall part is higher than a resistance of a portion located on the first electrode.

[B2]

The method for manufacturing a display device according to [B1],
  in which among the material layers constituting the organic layer, the material layer arranged closest to the second electrode side is formed such that the portion located on the slope of the partition wall part is thicker than the portion located on the first electrode.

[B3]

The method for manufacturing a display device according to [B1],
  in which among the material layers constituting the organic layer, the material layer arranged closest to the second electrode side is formed such that the portion located on the slope of the partition wall part has a higher resistivity than the portion located on the first electrode.

[C1]

An electronic apparatus having a display device that includes:
  first electrodes formed to be arranged in a two-dimensional matrix on a substrate;
  a partition wall part provided between the first electrodes adjacent to each other and having a cross-sectional shape whose width decreases as it moves away from the substrate;
  an organic layer formed on an entire surface including surfaces of the first electrodes and the partition wall parts and formed by laminating a plurality of material layers; and
  a second electrode formed on an entire surface including a surface of the organic layer,
  in which among the plurality of material layers constituting the organic layer, a material layer arranged closest to the second electrode side is formed such that a resistance of a portion located on a slope of the partition wall part is higher than a resistance of a portion located on the first electrode.

[C2]

The electronic apparatus according to [C1],
  in which among the material layers constituting the organic layer, the material layer arranged closest to the second electrode side is formed such that the portion located on the slope of the partition wall part is thicker than the portion located on the first electrode.

[C3]

The electronic apparatus according to [C1],
  in which among the material layers constituting the organic layer, the material layer arranged closest to the second electrode side is formed such that the portion located on the slope of the partition wall part has a higher resistivity than the portion located on the first electrode.

[C4]

The electronic apparatus according to any one of [C1] to [C3],
  in which among the material layers constituting the organic layer, the material layer arranged closest to the second electrode side includes an electron transport material or an electron injection material.

[C5]
The electronic apparatus according to any one of [C4], in which among the material layers constituting the organic layer, the material layer arranged closest to the second electrode side includes lithium fluoride.

[C6]
The electronic apparatus according to any one of [C5], in which the material layer including lithium fluoride is formed such that the portion located on the slope of the partition wall part is thicker than the portion located on the first electrode.

[C7]
The electronic apparatus according to [C4], in which among the material layers constituting the organic layer, the material layer arranged closest to the second electrode side includes a co-deposited film of calcium and lithium fluoride.

[C8]
The electronic apparatus according to [C7], in which the material layer including the co-deposited film of calcium and lithium fluoride is formed such that the portion located on the slope of the partition wall part is thicker than the portion located on the first electrode.

[C9]
The electronic apparatus according to [C8], in which the material layer including the co-deposited film of calcium and lithium fluoride is formed such that the portion located on the slope of the partition wall part has a higher resistivity than the portion located on the first electrode by being formed such that a concentration of lithium fluoride in the portion located on the slope of the partition wall part is higher than a concentration of lithium fluoride in the portion located on the first electrode.

[C10]
The electronic apparatus according to any one of [C1] to [C9], in which the organic layer includes a light-emitting layer formed in common for each first electrode.

[C11]
The electronic apparatus according to any one of [C1] to [C9], in which the organic layer includes a light-emitting layer formed individually for each first electrode.

REFERENCE SIGNS LIST 1, 2, 3, 4 Display device
10 Substrate
21 Gate electrode
22 Gate insulating film
23 Semiconductor material layer
24 Interlayer insulating film
25 Electrode
26 Flattening film
27 Contact plug
31 First electrode (anode electrode)
32 Partition wall part
40, 240, 340, 440 Organic layer
41, 241, 341, 441 Portion of organic layer excluding material
layer on second electrode side
42, 242, 342, 442, 442A Material layer on second electrode side
51 Second electrode
61 Protective film
62 Color filter
63 Counter substrate
70 Pixel
80 Display region
110 Source driver
120 Vertical scanner
130 Power supply unit
411 Camera main body part
412 Imaging lens unit
413 Grip part
414 Monitor
415 Viewfinder
511 Eyeglass-shaped display unit
512 Ear hooking part
600 Glasses (eyewear)
611 See-through head-mounted display
612 Main body part
613 Arm
614 Lens barrel

The invention claimed is:

1. A display device, comprising: a substrate;
a plurality of electrodes in a two-dimensional matrix on the substrate,
wherein the plurality of electrodes includes a first electrode and a second electrode, the first electrode Is adjacent to the second electrode;
a partition wall part between the first electrode and the second electrode, wherein the partition wall part has a cross-sectional shape and a width of the partition wall part decreases as the partition wall part moves away from the substrate;
an organic layer on a surface of the plurality of electrodes and a surface of the partition wall part, wherein the organic layer includes a plurality of material layers; and
a third electrode on a surface of the organic layer,
wherein the plurality of material layers includes a first material layer, the first material layer is closest to the third electrode, and
the first material layer includes: a first portion on a slope of the partition wall part; and a second portion on the first electrode, wherein a resistance of the first portion is higher than a resistance of the second portion.

2. The display device according to claim 1, wherein the first portion is thicker than the second portion.

3. The display device according to claim 1, wherein
the plurality of material layers further includes a second material layer, and
the second material layer includes a hole injection layer or a hole transport layer.

4. The display device according to claim 1, wherein the first material layer includes an electron transport material or an electron injection material.

5. The display device according to claim 4, wherein the first material layer further includes lithium fluoride.

6. The display device according to claim 5, wherein the first portion is thicker than the second portion.

7. The display device according to claim 4, wherein the first material layer further includes a co-deposited film of calcium and lithium fluoride.

8. The display device according to claim 7, wherein the first portion is thicker than the second portion.

9. The display device according to claim 8, wherein
the first portion has a higher resistivity than the second portion, and
a concentration of lithium fluoride in the first portion is higher than a concentration of lithium fluoride in the second portion.

10. The display device according to claim 1, wherein the organic layer further includes a light-emitting layer formed in common for each of the plurality of electrodes.

11. The display device according to claim 1, wherein the organic layer further includes a light-emitting layer formed individually for each of the plurality of electrodes.

12. A method for manufacturing a display device, comprising:
forming a substrate;
forming a plurality of electrodes by arranging the plurality of electrodes in a two-dimensional matrix on the substrate, wherein
the plurality of electrodes includes a first electrode and a second electrode,
the first electrode is adjacent to the second electrode;
providing, between the first electrode and the second electrode, a partition wall part, wherein
the partition wall part having a cross-sectional shape, and
a width of the partition wall part decreases as the partition wall part moves away from the substrate;
forming, on a surface of the plurality of electrodes and a surface of the partition wall part, an organic layer by laminating a plurality of material layers; and
forming a third electrode on a surface of the organic layer, wherein the formation of the organic layer includes:
forming a first material layer that includes:
a first portion on a slope of the partition wall part; and
a second portion on the first electrode, wherein a resistance of the first portion is higher than a resistance of the second portion.

13. The method for manufacturing the display device according to claim 12, wherein the first portion is thicker than the second portion.

14. The method for manufacturing the display device according to claim 12, wherein
the plurality of material layers further includes a second material layer, and
the second material layer includes a hole injection layer or a hole transport layer.

15. An electronic apparatus, comprising:
a display device that includes:
a substrate;
a plurality of electrodes in a two-dimensional matrix on the substrate, wherein:
the plurality of electrodes includes a first electrode and a second electrode,
the first electrode is adjacent to the second electrode;
a partition wall part between the first electrode and the second electrode, wherein
the partition wall part has a cross-sectional shape, and
a width of the partition wall part decreases as the partition wall part moves away from the substrate;
an organic layer on a surface of the plurality of electrodes and a surface of the partition wall part, wherein the organic layer includes a plurality of material layers; and
a third electrode on a surface of the organic layer, wherein
the plurality of material layers includes a first material layer,
the first material layer is closest to the third electrode, and
the first material layer includes:
a first portion on a slope of the partition wall part; and
a second portion on the first electrode, wherein a resistance of the first portion is higher than a resistance of the second portion.

* * * * *